(12) United States Patent
Yuan

(10) Patent No.: US 11,957,012 B2
(45) Date of Patent: Apr. 9, 2024

(54) DISPLAY PANEL AND DISPLAY DEVICE WITH SUB-SIGNAL LINE OVERLAPPING OPENING IN PLANARIZATION LAYER

(71) Applicant: Xiamen Tianma Micro-Electronics Co., Ltd., Xiamen (CN)

(72) Inventor: Yong Yuan, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 469 days.

(21) Appl. No.: 17/235,898

(22) Filed: Apr. 20, 2021

(65) Prior Publication Data

US 2021/0242297 A1    Aug. 5, 2021

(30) Foreign Application Priority Data

Nov. 25, 2020    (CN) .......................... 202011339975.9

(51) Int. Cl.
*H10K 59/131*    (2023.01)
*H10K 59/124*    (2023.01)

(52) U.S. Cl.
CPC ......... *H10K 59/131* (2023.02); *H10K 59/124* (2023.02)

(58) Field of Classification Search
CPC .......................... H10K 59/131; H10K 59/124
See application file for complete search history.

(56) References Cited

U.S. PATENT DOCUMENTS

| | | | | |
|---|---|---|---|---|
| 2015/0228927 A1* | 8/2015 | Kim | ..................... | H10K 59/131 |
| | | | | 257/40 |
| 2016/0204373 A1* | 7/2016 | Park | ..................... | H10K 59/124 |
| | | | | 257/40 |
| 2017/0170206 A1* | 6/2017 | Lee | ..................... | H01L 27/1218 |
| 2019/0288234 A1* | 9/2019 | Kim | ..................... | H10K 50/8426 |
| 2019/0341439 A1* | 11/2019 | Choi | ..................... | H10K 59/122 |
| 2020/0176484 A1* | 6/2020 | Yin | ..................... | H01L 27/1259 |
| 2021/0193764 A1* | 6/2021 | Cho | ..................... | H10K 59/131 |

\* cited by examiner

*Primary Examiner* — Lex H Malsawma
(74) *Attorney, Agent, or Firm* — KILPATRICK TOWNSEND & STOCKTON LLP

(57) ABSTRACT

Provided is a display panel, and the display panel includes a base substrate, a first signal line, a planarization layer, a light-emitting element and a pixel spacer layer. The first signal line is disposed on the base substrate, where the first signal line includes a first sub signal line and a second sub signal line which are electrically connected to each other and are disposed in different layers, and the first sub signal line is disposed on one side of the second sub signal line facing toward the base substrate. The planarization layer is disposed on one side of the first signal line facing away from the base substrate. The light-emitting element and the pixel spacer layer are disposed on one side of the planarization layer facing away from the base substrate. The planarization layer includes a first opening.

19 Claims, 19 Drawing Sheets

DISPLAY PANEL AND DISPLAY DEVICE WITH SUB-SIGNAL LINE OVERLAPPING OPENING IN PLANARIZATION LAYER

CROSS-REFERENCES TO RELATED APPLICATIONS

This application claims the priority to a Chinese patent application No. CN202011339975.9 filed at the CNIPA on Nov. 25, 2020, disclosure of which is incorporated herein by reference in its entirety.

FIELD

Embodiments of the present disclosure relate to the field of display technologies and, in particular, to a display panel and a display device.

BACKGROUND

With the development of display technologies, liquid crystal display panels and organic light-emitting display panels have gradually become two mainstream display panels, which are widely used in electronic devices such as mobile phones, computers, and notebooks.

In the related art, a display panel generally includes a planarization layer for the planarization process on the film layer located thereunder, and to ensure the planarization effect, the planarization layer generally adopts organic materials. However, the organic materials form a water and oxygen transmission path, so that water and oxygen will enter a display region through the planarization layer, affecting the normal display of the display panel.

SUMMARY

The present disclosure provides a display panel and a display device to solve the problem that a first signal line is easily corroded by water and oxygen and thus to improve the yield of the display panel.

In one embodiments of the present disclosure provide a display panel. The display panel includes a base substrate, a first signal line, a planarization layer, a light-emitting element and a pixel spacer layer.

The first signal line is disposed on the base substrate, where the first signal line includes a first sub signal line and a second sub signal line which are electrically connected to each other and are disposed in different layers, and the first sub signal line is disposed on one side of the second sub signal line facing toward the base substrate.

The planarization layer is disposed on one side of the first signal line facing away from the base substrate.

The light-emitting element and the pixel spacer layer are disposed on one side of the planarization layer facing away from the base substrate.

The planarization layer includes a first opening, and along a direction perpendicular to the base substrate, the first sub signal line at least partially overlaps with the first opening.

In one the embodiments of the present disclosure further provide a display device. The display device includes the display panel provided by other embodiments.

According to the display panel provided by the embodiments of the present disclosure, by configuring the first signal line to include the first sub signal line and the second sub signal line which are electrically connected to each other, the first sub signal line is disposed on the side of the second sub signal line facing toward the base substrate, and an orthographic projection of the first signal line on the base substrate at least partially overlaps with an orthographic projection of the first opening on the planarization layer on the base substrate, so that the first sub signal line that may originally be in a same layer as the second sub signal may be moved down by at least one layer. Therefore, the insulating layer between the first sub signal line and the second sub signal line can at least cover part of the first sub signal line, the risk that the first sub signal line is exposed by the first opening is reduced, the problem that the first sub signal line is exposed to be corroded is resolved, and the yield of the display panel is improved.

DETAILED DESCRIPTION

Figure 1:
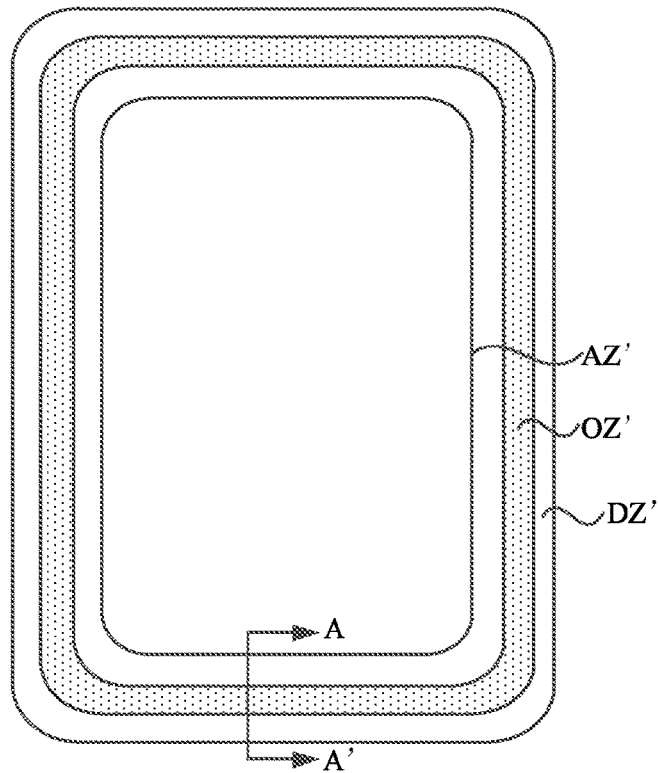
FIG. 1 is a structural diagram of a display panel in the related art.

The present disclosure is further described below in detail in conjunction with drawings and embodiments. It is to be understood that the embodiments described herein are merely intended to explain the present disclosure and are not to limit the present disclosure. Additionally, it should be noted that for easy of description, only the part related to the present disclosure, instead of all, is illustrated in the drawings.

Figure 2:
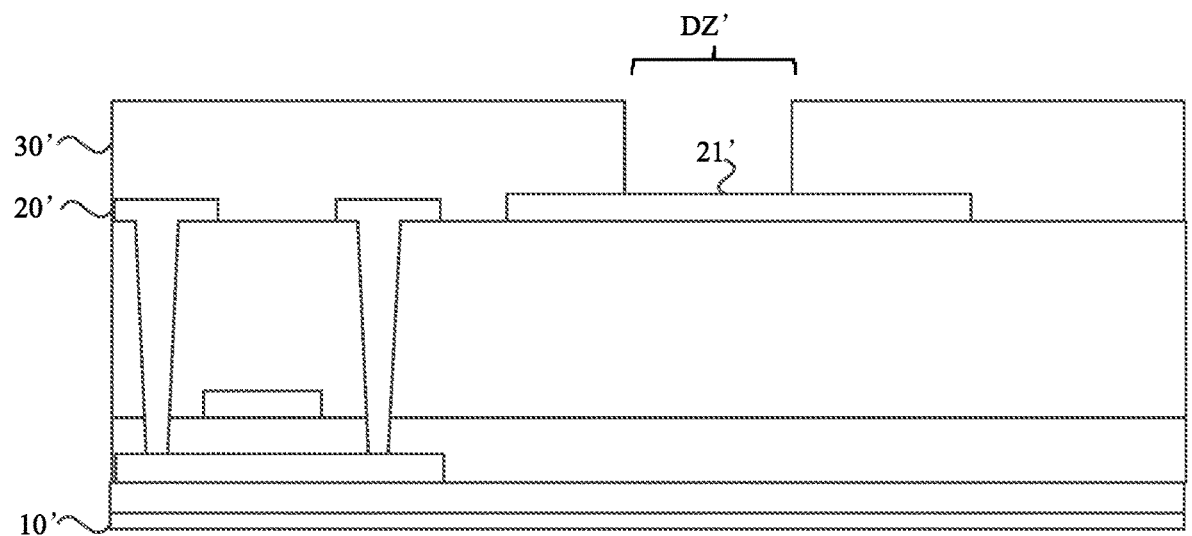
FIG. 2 is a cross-sectional view taken along the section line A-A' in FIG. 1.

Considering the problem pointed out in the Background, removing the planarization layer between the display region and the non-display region can cut off the water-oxygen transmission path. However, if doing so, the film layers below the planarization layer will be exposed, so that the normal operation of the film layers below the planarization layer is affected, and thus the normal operation of the display panel is affected. FIG. 1 is a structural diagram of a display panel in the related art. FIG. 2 is a cross-sectional view taken along the section line A-A' in FIG. 1. Referring to FIG. 1, a display panel includes a display region AZ' and a non-display panel DZ' surrounding the display region, and the non-display region DZ' includes an organic film clearance region OZ'. Referring to FIG. 2, the display panel includes a base 10', a source-drain metal layer 20' (a metal layer where a source electrode and a drain electrode of a transistor are located) and a planarization layer 30'. The planarization layer 30' is disposed on one side of the source-drain metal layer 20' facing away from the base 10', and a first signal line 21' is disposed in the source-drain metal layer 20'. In order to prevent water and oxygen from entering, the planarization layer 30' in the organic film clearance region DZ' is generally removed, blocking the path of water and oxygen from spreading from the non-display region DZ' to the display region AZ'. However, the first signal line 21' disposed in the organic film clearance region OZ' will be exposed and will be easily corroded by water and oxygen, thus leading to a decrease in the yield of the display panel.

Based on the above problem, the embodiments of the present disclosure provide a display panel. The display panel includes a base substrate, a first signal line, a planarization layer, a light-emitting element and a pixel spacer layer. The first signal line is disposed on the base substrate, where the first signal line includes a first sub signal line and a second sub signal line which are electrically connected to each other and are disposed in different layers, and the first sub signal line is disposed on one side of the second sub signal line facing toward the base substrate. The planarization layer is disposed on one side of the first signal line facing away from the base substrate. The light-emitting element and the pixel spacer layer are disposed on one side of the planarization layer facing away from the base substrate. The planarization layer includes a first opening, and along a direction perpendicular to the base substrate, the first sub signal line at least partially overlaps with the first opening. By adopting above solution, the first signal line including the first sub signal line and the second sub signal line which are electrically connected to each other is disposed, the first sub signal line is disposed on the side of the second sub signal line facing toward the base substrate, and an orthographic projection of the first signal line on the base substrate at least partially overlaps with an orthographic projection of the first opening on the planarization layer on the base substrate, so that the first sub signal line that may originally be in a same layer as the second sub signal may be moved down by at least one layer. Therefore, the insulating layer between the first sub signal line and the second sub signal line can at least cover part of the first sub signal line, the risk that the first sub signal line is exposed by the first opening is reduced, the problem that the first sub signal line is exposed to be corroded is eased, the risk that the first sub signal line is exposed by the first opening is reduced, and the yield of the display panel is improved.

The above is one embodiment of the present disclosure. Hereinafter, solutions in the embodiments of the present disclosure will be described clearly and completely in conjunction with drawings in the embodiments of the present disclosure. Apparently, the embodiments described below are part, not all, of the embodiments of the present disclosure.

Figure 3:
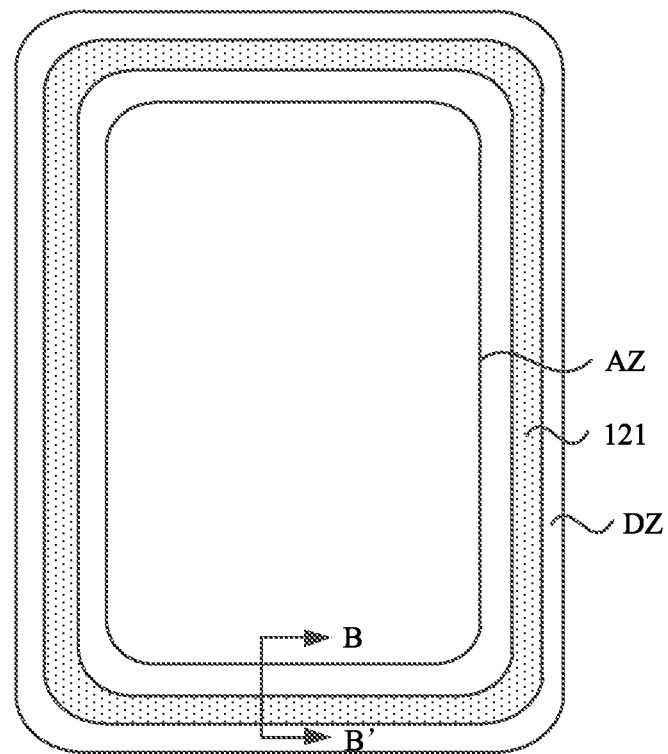
FIG. 3 is a structural diagram of a display panel according to an embodiment of the present disclosure.
Figure 4:
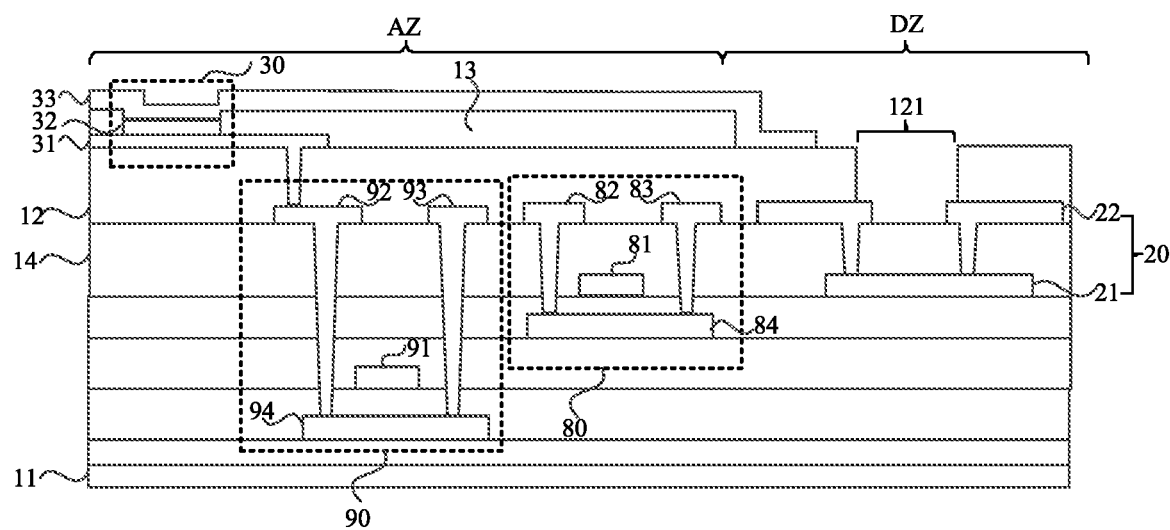
FIG. 4 is a cross-sectional view taken along the section line B-B' in FIG. 3.
Figure 5:
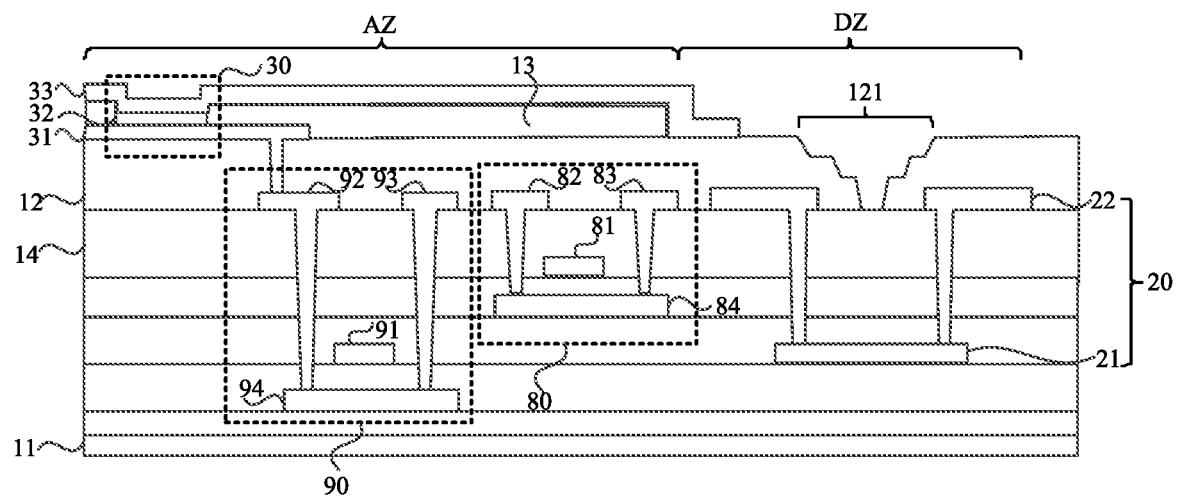
FIG. 5 is another cross-sectional view taken along the section line B-B' in FIG. 3.

FIG. 3 is a structural diagram of a display panel according to an embodiment of the present disclosure. FIG. 4 is a cross-sectional view taken along the section line B-B' in FIG. 3. FIG. 5 is another cross-sectional view taken along the section line B-B' in FIG. 3. Referring to FIG. 1 and FIG. 3, the display panel includes a base substrate 11, a first signal line 20, a planarization layer 12, a light-emitting element 30 and a pixel spacer layer 13. The first signal line 30 is disposed on the base substrate 11, where the first signal line 20 includes a first sub signal line 21 and a second sub signal line 22 which are electrically connected to each other and are disposed in different layers, and the first sub signal line 21 is disposed on one side of the second sub signal line 22 facing toward the base substrate. The planarization layer 12 is disposed on one side of the first signal line 20 facing away from the base substrate 11. The light-emitting element 30 and the pixel spacer layer 13 are disposed on one side of the planarization layer 12 facing away from the base substrate 11. The planarization layer 12 includes a first opening 121, and along a direction perpendicular to the base substrate 11, the first sub signal line 21 at least partially overlaps with the first opening 121.

In one embodiment, the display panel may be an organic light-emitting display panel or other display panels.

In one embodiment, the base substrate 11 is configured to support and protect the film layers thereon. The base substrate 11 may be a rigid substrate, for example, the material of the base substrate 11 may be glass. The base substrate 11 may also be a flexible substrate, for example, the material of the base substrate 11 may include one or a combination of polymer resins of polyethersulfone, polyacrylate, polyetherimide, polyethylene naphthalate, polyethylene terephthalate, polyphenylene sulfide, polyarylate, polyimide, polycarbonate and cellulose acetate propionate. The material of the base substrate 11 is not limited herein.

In one embodiment, the planarization layer 12 serves to provide a flat surface. The material of the planarization layer 12 includes organic materials, which may be, for example, one or a combination of polyimide, polyethylene terephthalate, polycarbonate, polyethylene and polyacrylate. The material of the planarization layer 12 is not limited herein.

In one embodiment, the planarization layer 12 is provided with a first opening 121. The first opening 121 is configured to resolve the problem that the display panel loses efficacy due to the spreading of water and oxygen from the non-display region DZ to the display region AZ. An orthographic projection of the first opening 121 on the base substrate 11 at least partially surrounds the display region AZ. In one embodiment, the orthographic projection of the first opening 121 on the base substrate 11 completely surrounds the display region AZ. Thus, the first opening 121 can completely block the transmission path of water and oxygen from the non-display region DZ to the display region AZ. The specific shape of the first opening 121 may be according to practical situations and is not limited herein. In one embodiment, a section of the first opening 121 may be rectangular (as shown in FIG. 4), trapezoidal, circular arc-shaped, stepped (as shown in FIG. 5) or other shapes. The orthographic projection of the first opening 121 on the base substrate 11 may be rectangular ring-shaped, circular ring-shaped or other shapes.

In one embodiment, the light-emitting element 30 includes an anode layer 31, a cathode layer 33 and a light-emitting layer 32, and the light-emitting layer 32 is disposed between the anode layer 31 and the cathode layer 33. The pixel spacer layer 13 is provided with a plurality of discrete openings, the light emitting layers 32 are disposed in the discrete openings, so that adjacent light-emitting elements 30 can be spaced apart by the pixel spacer layer 13. The light-emitting element 30 may further include an auxiliary light-emitting layer for promoting recombination of holes provided by the anode and electrons provided by the cathode in the light-emitting layer. In one embodiment, the auxiliary light-emitting layer includes one or more of an electron injection layer, an electron transport layer, an electron blocking layer, a hole blocking layer, a hole transport layer and a hole injection layer, which is not limited herein. In one embodiment, the light-emitting element 30 may include one or more of a red light-emitting element, a green light-emitting element, a blue light-emitting element, a white light-emitting element, a yellow light-emitting element, a cyan light-emitting element and a magenta light-emitting element, which is not limited herein.

In one embodiment, the first signal line 20 is configured to transmit a signal, and the specific type of the signal to be transmitted may be according to practical situations and is not limited herein. In one embodiment, the first signal line 20 is configured to transmit a data signal, a power signal, etc. In one embodiment, the first signal line 20 includes the first sub signal line 21 and the second sub signal line 22, and an orthographic projection of the first sub signal line 21 on the base substrate 11 at least partially overlaps with the orthographic projection of the first opening 121 on the base substrate 11. At this time if the first sub signal line 21 is disposed on the surface of one side of the planarization layer 12 facing toward the base substrate 11, the first opening 121 will expose the first sub signal line 21, and the exposed first sub signal line 21 is easily corroded. However, in the present disclosure, the first sub signal line 21 and the second sub signal line 22 are disposed in different layers, in other words, the first sub signal line 21 that may originally be in a same layer as the second sub signal line 22 is moved down by at least one layer, the first sub signal line 21 can be at least partially covered by an insulating layer between the first sub signal line 21 and the second sub signal line 22, so that the area of the first sub signal line 21 exposed by the first opening 121 can be reduced, and further, the risk of the first sub signal line 21 to be corroded by water and oxygen is reduced. It should be noted that the part where the orthographic projection of the first sub signal line 21 on the base substrate 11 overlaps with the orthographic projection of the first opening 121 on the base substrate 11 is recorded as an exposed signal segment, and the area of the exposed signal segment covered by the insulating layer between the first sub signal line 21 and the second sub signal line 22 may be according to practical situations and is not limited herein. In one embodiment, the exposed signal segment is completed covered by the insulating layer between the first sub signal line 21 and the second sub signal line 22, as shown in FIGS. 4 and 5, so that the first sub signal line 21 is prevented from being exposed and corroded by water and oxygen.

According to the display panel provided by the embodiments of the present disclosure, the first signal line including the first sub signal line and the second sub signal line which are electrically connected to each other is disposed, the first sub signal line is disposed on the side of the second sub signal line facing toward the base substrate, and the orthographic projection of the first signal line on the base substrate at least partially overlaps with the orthographic projection of the first opening on the planarization layer on the base substrate, so that the first sub signal line that may originally be in a same layer as the second sub signal may be moved down by at least one layer. Therefore, the insulating layer between the first sub signal line and the second sub signal line can at least cover part of the first sub signal line, the risk that the first sub signal line is exposed by the first opening is reduced, the problem that the first sub signal line is exposed to be corroded is eased, the risk that the first sub signal line is exposed by the first opening is reduced, and the yield of the display panel is improved.

Still referring to FIG. 4, In one embodiment, along the direction perpendicular to the base substrate 11, S1 is an area of a portion of the first sub signal line 21 that overlaps with the first opening 121, S2 is an area of a portion of the second sub signal line 22 that overlaps with the first opening 121, and S1>S2≥0.

It is to be understood that the second sub signal line 22 is closer to the planarization layer 12 than the first sub signal line 21 and is more easily exposed by the first opening 121. That is, the risk of the second sub signal line 22 to be exposed by the first opening 121 is greater, so that setting S1>S2 may enable the risk of the first signal line 20 to be exposed to be relatively small, the exposed area can be minimized even if the first signal line 20 is exposed by the first opening 121, and thus the risk of the first signal line 20 to be corroded by water and oxygen is relatively small.

Figure 6:
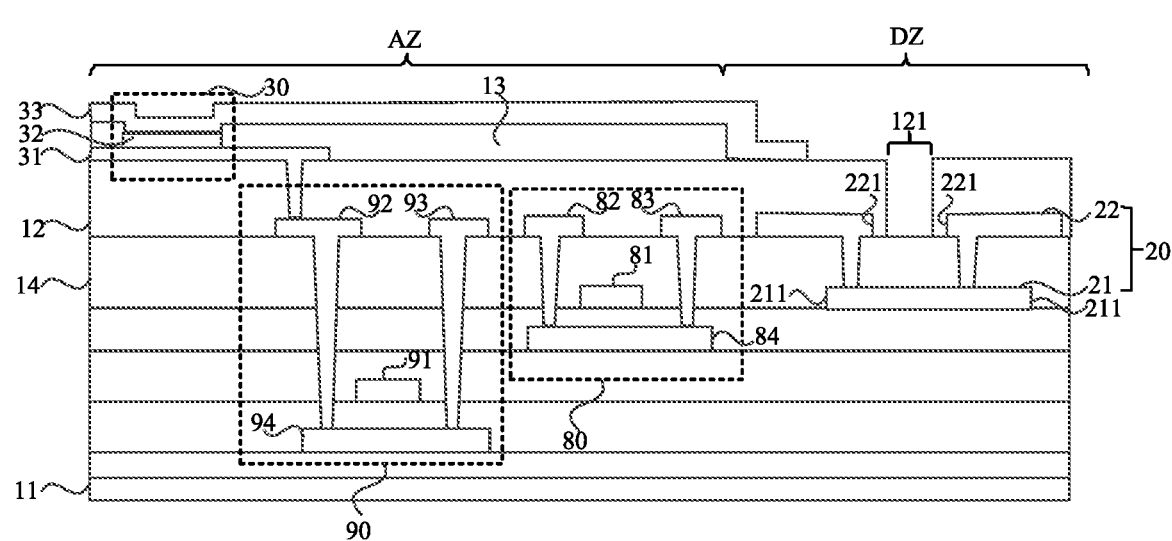
FIG. 6 is another cross-sectional view taken along the section line B-B' in FIG. 3.

FIG. 6 is another cross-sectional view taken along the section line B-B' in FIG. 3. Referring to FIG. 6, In one embodiment, the second sub signal line 22 includes a first side edge 221 closest to the first opening 121, and the first side edge 221 is completely covered by the planarization layer 12.

In one embodiment, the second sub signal line 22 may be made of titanium aluminum titanium material with a small sheet resistance value, that is, the second sub signal line 22 includes three layers, two film layers of titanium sandwiching one film layer of aluminum, so that the resistance of the second sub signal line 22 can be reduced, and the signal loss can be lowered. It is to be understood that aluminum is more easily corroded by water and oxygen than titanium. Through the setting of the first side edge 221 of the second sub signal line 22 completely covered by the planarization layer 12, the part of the second sub signal line 22 that is most easily corroded by water and oxygen corrosion is not exposed, so that the risk of the second sub signal line 22 being corroded by water and oxygen is reduced.

It is further to be understood that through the setting of the planarization layer 12 completely covering the first side edge 221, the second sub signal line 22 can be completely covered by the planarization layer 12, so that the second sub signal line 22 may be prevented from being exposed, and the risk of the first signal line 20 being corroded by water and oxygen is be reduced.

Still referring to FIG. 6, In one embodiment, the first sub signal line 21 extends along a first direction X, and along the first direction X, a length of the first sub signal line 21 is greater than a length of the first opening 121.

In one embodiment, the first sub signal line 21 includes two second side edges 211, which are disposed at two ends of the first sub signal line 21. Along the direction perpendicular to the base substrate 11, neither of the two second side edges 211 overlaps with the first opening 121.

In one embodiment, the first sub signal line 21 may adopt the titanium aluminum titanium material with a small sheet resistance value, so that the resistance of the first sub signal line 21 can be reduced, and the signal loss can be lowered. It is to be understood that along the first direction X, through the setting of the length of the first sub signal line 21 greater than the length of the first opening 121, the wiring at the first opening 121 can be achieved entirely through the first sub signal line 21, and after the first sub signal line 21 passes through the first opening 121 by a distance, the first sub signal line 21 is replaced by the second sub signal line 22 for wiring, so that the part of the first sub signal line 21 that is most easily corroded by water and oxygen is not exposed, and the second sub signal line 22 can be fully prevented from losing efficacy due to corrosion. It should be noted that along the first direction X, the length of the first sub signal line 21 and the length of the first opening 121 may be according to practical situations and are not limited herein.

Figure 7:
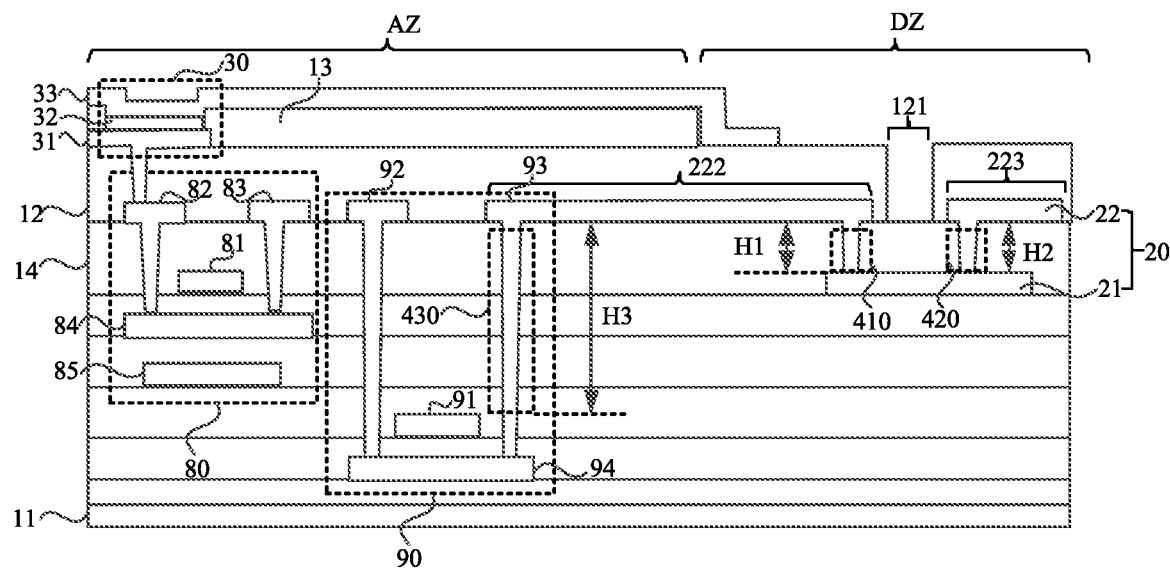
FIG. 7 is another cross-sectional view taken along the section line B-B' in FIG. 3.

FIG. 7 is another cross-sectional view taken along the section line B-B' in FIG. 3. Referring to FIG. 7, In one embodiment, the second sub signal line 22 includes a first line segment 222 and a second line segment 223, at least part of the first line segment extends to the display region AZ of the display panel, and the first sub signal line 21 is disposed in the non-display region DZ of the display panel. A first end of the first sub signal line 21 is connected to an end of the first line segment 222 through a first via hole 410, the first via hole 410 is disposed in the non-display region DZ, and along the direction perpendicular to the base substrate 11 being taken as a projection direction, the first via hole 410 does not overlap with the first opening 121.

It is to be understood that along the direction perpendicular to the base substrate 11 being taken as a projection direction, the first via hole 410 does not overlap with the first opening 121, the first via hole 410 may not be disposed at the first opening 121, so that the second sub signal line 22 can be prevented from losing efficacy due to corrosion by water and oxygen. It should be noted that the distance between the vertical projection of the first via hole 410 and the vertical projection of the first opening 121 on the base substrate 11 may be according to practical situations and is not limited herein.

Still referring to FIG. 7, In one embodiment, the second line segment 223 is disposed in the non-display region DZ, and a second end of the first sub signal line 21 is connected to an end of the second line segment 221 through a second via hole 420. The second via hole 420 is disposed in the non-display region DZ, and along the direction perpendicular to the base substrate 11, the second via hole 420 does not overlap with the first opening 121.

It is to be understood that along the direction perpendicular to the base substrate 11 being taken as a projection direction, the second via hole 420 does not overlap with the first opening 121, the second via hole 420 may not be disposed at the first opening 121, so that the second sub signal line 22 can be further prevented from losing efficacy due to corrosion by water and oxygen. It should be noted that the distance between the vertical projection of the second via hole 420 and the vertical projection of the first opening 121 on the base substrate 11 may be according to practical situations and is not limited herein.

Still referring to FIG. 7, In one embodiment, the second sub signal line 22 is disposed in the display region AZ of the display panel and is connected to an active layer of one transistor through a third via hole 420. Along the direction perpendicular to the base substrate 11, a depth of the first via hole is H1, a depth of the third via hole is H3, and $H1 \leq \frac{1}{2} \times H3$. In one embodiment, a depth of the second via hole 420 is H2, and $H2 \leq \frac{1}{2} \times H3$.

It is to be understood that through the setting of $H1 \leq \frac{1}{2} \times H3$, the depth of the first via hole 410 can be made relatively shallow, so that the transmission loss of the first signal line 20 due to the first via hole 410 can be reduced, and if the depth of the first via hole 410 is made relatively shallow, the process requirements can be relatively low, and the process is facilitated to be simplified. The same is true for the second via hole 420, which is not repeated herein. Exemplarily, when the first signal line 20 is configured to transmit a first power signal (a PVDD signal), the PVDD signal will be transmitted to a transistor sequentially through the second line segment 223, the second via hole 420, the first sub signal line 21, the first via hole 410, the first line segment 222 and the third via 430 hole. The depth of the first via hole 410 (or the second via hole 420) being set relatively shallow enables the loss of the PVDD signal in the whole transmission process to be relatively small, avoiding the impact on a drive current and ensuring the accurate driving of the display panel. It should be noted that the specific depths of the first via hole 410, the second via hole 420 and the third via hole 430 may be according to practical situations and are not limited herein.

Still referring to FIG. 7, In one embodiment, the second sub signal line 22 is disposed in the display region AZ of the display panel and is connected to an active layer of one transistor through the third via hole 420. In the plane where one side of the first via hole 410 in contact with the second sub signal line 22 is located, an area of the first via hole 410 is larger than an area of the third via hole 430. In one embodiment, in the plane where one side of the second via hole 420 in contact with the second sub signal line 22 is located, an area of the second via hole 420 is larger than an area of the third via hole 430.

It is to be understood that through the setting of the area of the first via hole 410 larger than the area of the third via hole 430, the area of the first via hole 410 can be relatively large, so that the transmission loss of the first signal line 20 due to the first via hole 410 can be reduced. The same is true for the second via hole 420, which is not repeated herein. Exemplarily, when the first signal line 20 is configured to transmit the PVDD signal, the part of the first signal line 20 located in the non-display region DZ is referred to as a first power transmission line (PVDD transmission line), the part of the first signal line 20 located in the display region AZ is referred to as a PVDD signal line, and the line width of the PVDD transmission line is larger than the line width of the PVDD signal line. Through the setting of the area of the first via hole 410 larger than the area of the third via hole 430, the line width of the first via hole 410 and the line width of the PVDD transmission line can be matched, at the same time, the line width of the third via hole 430 and the line width of the PVDD signal line can be matched, and the signal loss on the PVDD transmission line can be reduced. It should be noted that the specific areas of the first via hole 410, the second via hole 420 and the third via hole 430 may be according to practical situations and are not limited herein.

Figure 8:
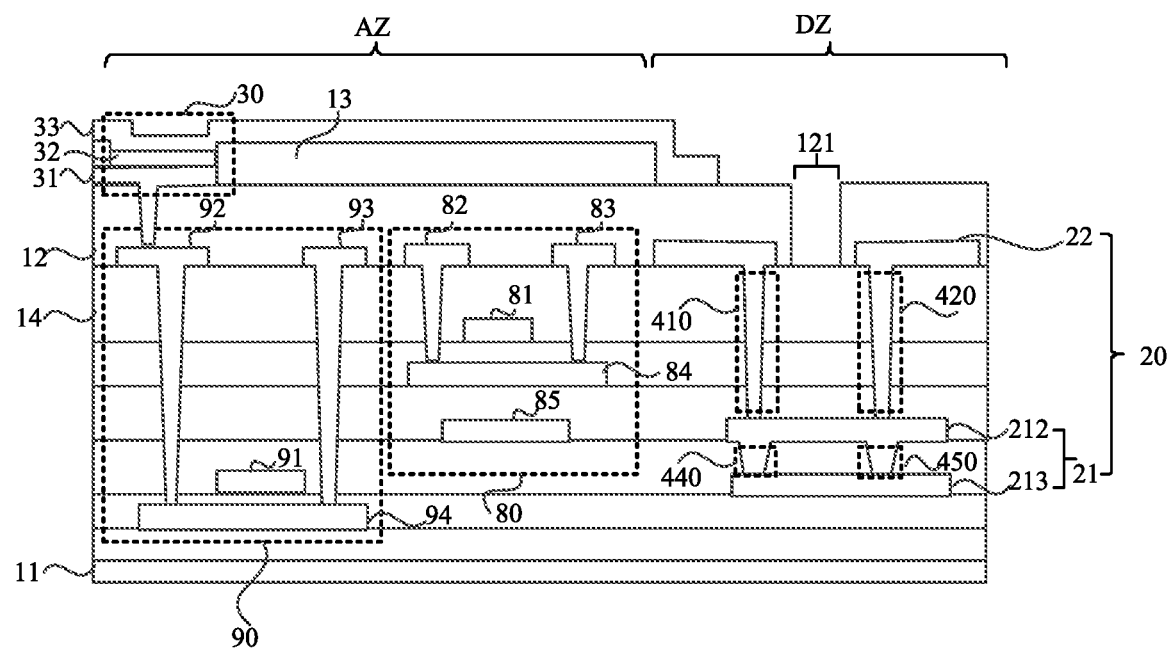
FIG. 8 is a cross-sectional view taken along the section line B-B' in FIG. 3.

FIG. 8 is a cross-sectional view taken along the section line B-B' in FIG. 3. Referring to FIG. 8, In one embodiment, the first sub signal line 21 includes a trace in a first layer 212 and a trace in a second layer 213 which are electrically connected to each other and are stacked, and along the direction perpendicular to the base substrate 11, the trace in the first layer 212 and the trace in the second layer 213 both at least partially overlap with the first opening 121.

In one embodiment, the trace in the first layer 212 may be disposed on one side of the trace in the second layer 213 facing toward the base substrate 11, or may be disposed on one side of the trace in the second layer 213 facing away from the base substrate 11, which is not limited herein. The trace in the first layer 212 and the trace in the second layer 214 may be connected through a via hole.

It is to be understood that through the setting of first sub signal line 21 as double-layer traces, the resistance on the first sub signal line 21 can be fully reduced, and the signal loss can be lowered.

Figure 9:
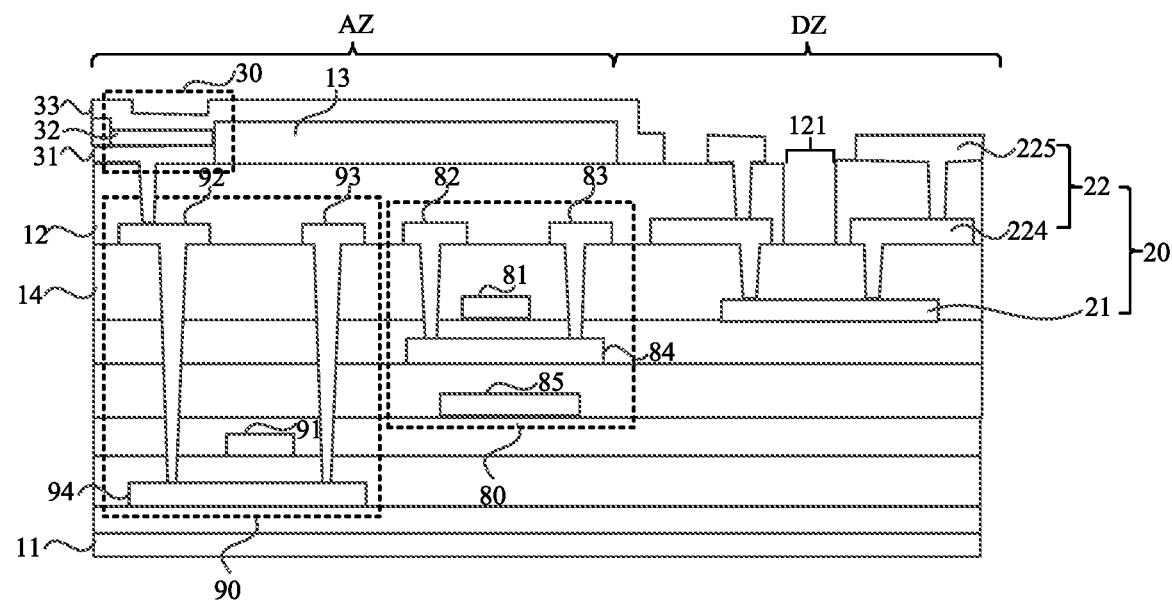
FIG. 9 is another cross-sectional view taken along the section line B-B' in FIG. 3.

FIG. 9 is another cross-sectional view taken along the section line B-B' in FIG. 3. Referring to FIG. 9, In one embodiment, the second sub signal line 22 includes a trace in a third layer 224 and a trace in a fourth layer 225 which are electrically connected to each other, the trace in the fourth layer 225 is disposed on one side of the planarization layer 12 facing away from the trace in the third layer 224, and the trace in the third layer 224 is electrically connected to the trace in the fourth layer 225 through a via hole. Along the direction perpendicular to the base substrate 11, the trace in the third layer 224 and the trace in the fourth layer 225 both do not overlap with the first opening 121.

It is to be understood that through the setting of second sub signal line 22 as double-layer traces, the resistance on the second sub signal line 22 can be fully reduced, and the signal loss can be lowered.

Still referring to FIG. 2 to FIG. 9, In one embodiment, along the direction perpendicular to the base substrate 11, a first insulating layer 14 is disposed between the first sub signal line 21 and the first opening 121, and the first insulating layer 14 includes silicon oxide or silicon oxynitride.

It is to be understood that some of the devices inside the display panel are very sensitive to the hydrogen content in the display panel. Since silicon oxide and silicon oxynitride have a good effect of blocking hydrogen, the setting of the first insulating layer 14 including silicon oxide or silicon oxynitride enables the first insulating layer 14 to have a good effect of blocking hydrogen for the devices inside the display panel. In addition, silicon nitride has a good effect of blocking water and oxygen, and when the first insulating layer 14 includes silicon nitride, the silicon nitride above the first sub signal line 21 can effectively prevent the first sub signal line 21 from being corroded by water and oxygen, so that the yield of the display panel is improved. It should be noted that the thickness of the first insulating layer 14 may be according to practical situations and is not limited herein.

Figure 10:
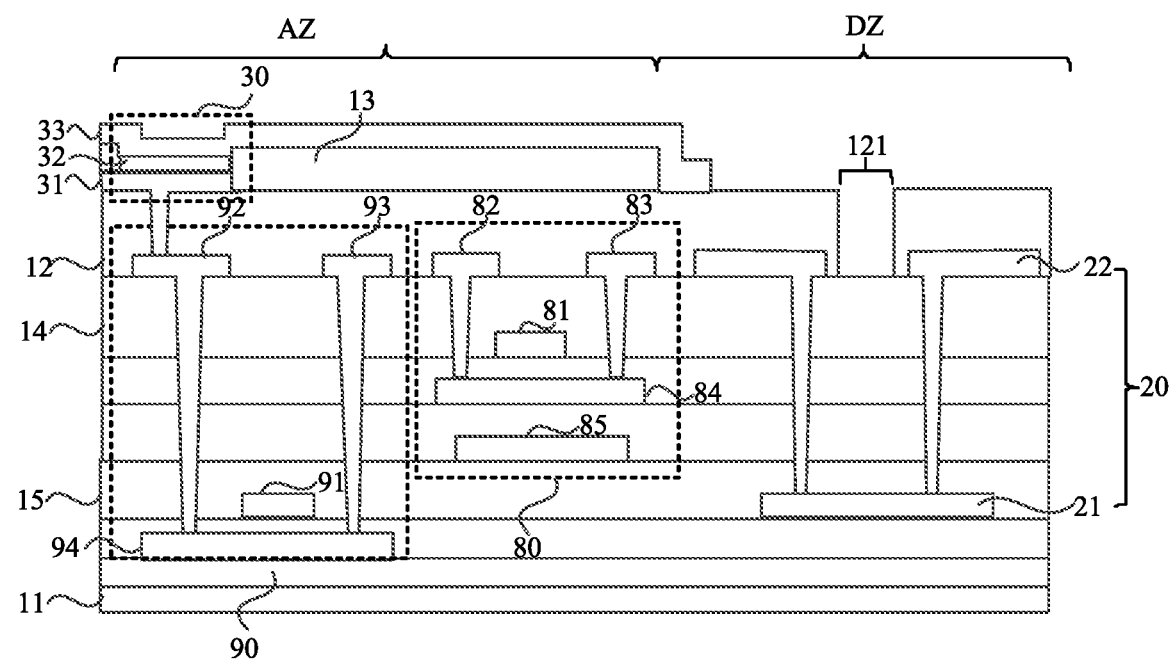
FIG. 10 is another cross-sectional view taken along the section line B-B' in FIG. 3.

FIG. 10 is another cross-sectional view taken along the section line B-B' in FIG. 3. Referring to FIG. 10, In one embodiment, along the direction perpendicular to the base substrate 11, a second insulating layer 15 stacked with the first insulating layer 14 is further disposed between the first sub signal line 21 and the first opening 121, the second insulating layer 15 includes silicon nitride, and the first insulating layer 14 is disposed on one side of the second insulating layer 15 facing toward the first sub signal line 21.

It is to be understood that silicon oxide has a better effect of blocking hydrogen than silicon nitride, and silicon nitride has a better effect of blocking water and oxygen than silicon oxide. Therefore, silicon nitride is disposed closer to the first opening 121 to block water and oxygen, in other words, silicon nitride with a stronger capability of blocking water and oxygen is disposed closer to the starting point of water and oxygen intrusion, so that water and oxygen can be strongly blocked as early as possible, and the impact on other devices caused by water and oxygen intrusion into the display panel is avoided. Then, silicon oxide is disposed closer to the first sub signal line 21 to block hydrogen. It should be noted that the specific thicknesses of the first insulating layer 14 and the second insulating layer 15 may be according to practical situations and are not limited herein.

Still referring to FIG. 10, In one embodiment, the thickness of the first insulating layer 14 is greater than the thickness of the second insulating layer 15.

It is to be understood that generally the hydrogen content in silicon nitride is higher than the hydrogen content in silicon oxide, so that hydrogen can be more fully blocked through the setting of the thickness of the first insulating layer 14 greater than the thickness of the second insulating layer 15.

In one embodiment, the hydrogen content of one side in the first insulating layer 14 facing toward the first sub signal line 21 is smaller than the hydrogen content of one side in the first insulating layer 14 facing away from the first sub signal line 21.

It is to be understood that through the setting of the hydrogen content of the side in the first insulating layer 14 facing toward the first sub signal line 21 smaller than the hydrogen content of the side in the first insulating layer 14 facing away from the first sub signal line 21, hydrogen can be more fully blocked. It should be noted that the hydrogen content everywhere in the first insulating layer 14 may be according to practical situations and is not limited herein. Exemplarily, the first insulating layer 14 includes a plurality of first sub insulating layers, and the closer the first sub insulating layer is to the first sub signal line 21, the smaller the hydrogen content of the first sub insulating layer will be.

Figure 11:
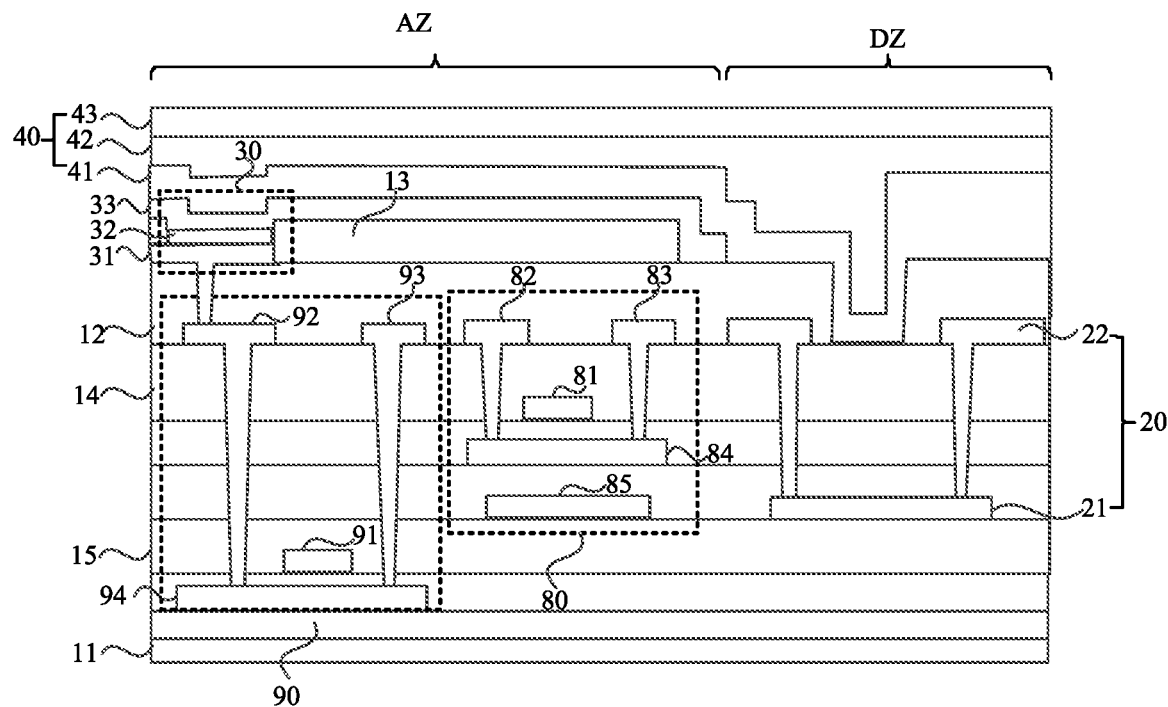
FIG. 11 is another cross-sectional view taken along the section line B-B' in FIG. 3.

FIG. 11 is another cross-sectional view taken along the section line B-B' in FIG. 3. Referring to FIG. 11, In one embodiment, the display panel further includes an encapsulation layer 40, where the encapsulation layer 40 includes a first inorganic layer 41, a second inorganic layer 43 and an organic layer 42 which is disposed between the first inorganic layer 41 and the second inorganic layer 43, and the second inorganic layer 43 is disposed on one side of the first inorganic layer 41 facing away from the base substrate 11. The encapsulation layer 40 fills the first opening 121, and the first inorganic layer 41 covers a surface of the first opening 121 facing toward the encapsulation layer 40. At least one insulating layer is disposed between the first inorganic layer 41 and the first sub signal line 21.

In one embodiment, the encapsulation layer 40 has a function of blocking water and oxygen. The materials of the first inorganic layer 41 and the second inorganic layer 43 may be aluminum oxide, silicon oxide, silicon nitride, silicon oxynitride, silicon carbide, titanium oxide, zirconium oxide, or zinc oxide or other inorganic materials, and the material of the organic layer 42 may be polyimide, polyethylene terephthalate, polycarbonate, polyethylene, or polyacrylate or other organic materials, which are not limited herein.

In one embodiment, the bottom and sidewall of the first opening 121 are covered by the first inorganic layer 41, in other words, the first inorganic layer 41 is filled in the first opening 121. It is to be understood that the encapsulation layer 40 covers the first opening 121 and that at least one insulating layer is disposed between the first inorganic layer 41 and the first sub signal line 21, so that the first sub signal line 21 is protected by the insulating layer from being corroded.

Figure 12:
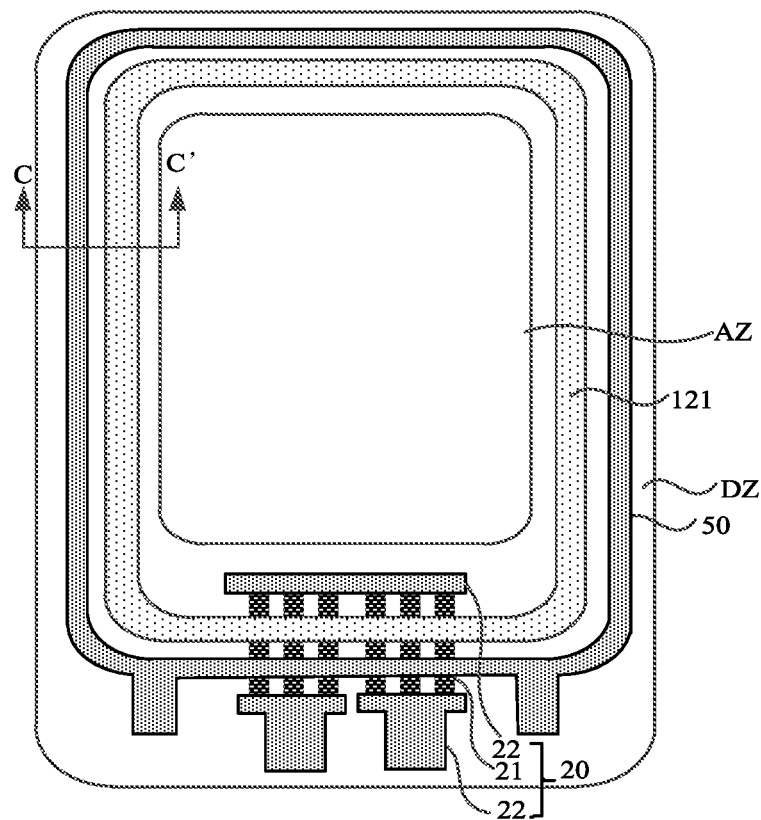
FIG. 12 is a structural diagram of another display panel according to an embodiment of the present disclosure.

FIG. 12 is a structural diagram of another display panel according to an embodiment of the present disclosure. In one embodiment, the display panel further includes a second signal line 50, where the second signal line 50 and the second sub signal line 22 are disposed in a same film layer, and along the direction perpendicular to the base substrate 11, the first sub signal line 21 at least partially overlaps with the second signal line 50.

It should be noted that the same film layer described herein and hereinafter refers to the film layer manufactured by a same process and, in general, is of a same material.

In one embodiment, the second signal line 50 is configured to transmit a signal, and the specific type of the signal to be transmitted may be according to practical situations and is not limited herein. In one embodiment, the second signal line 50 is configured to transmit a second power signal (a PVEE signal). It is to be understood that when the second signal line 50 is configured to transmit the PVEE signal, in order to achieve that the second signal line 50 does not overlap with the first opening 121 as much as possible along the direction perpendicular to the base substrate 11 and that the second signal line 50 surrounds a circle of the display region AZ as much as possible, it is necessary to set the first sub signal line 21 at least partially overlapping with the second signal line 50, so that the difficulty of the design of the first signal line 20 and the second signal line 50 can be reduced.

Still referring to FIG. 12, In one embodiment, along the direction perpendicular to the base substrate 11, the second signal line 50 does not overlap with the first opening 121. Thus, the second signal line 50 can be prevented from being exposed by the first opening 121 and from being corroded by water and oxygen, so that the yield of the display panel is facilitated to be improved.

Still referring to FIG. 12, In one embodiment, the display panel includes the display region AZ and the non-display region DZ, where the first opening 121 is disposed in the non-display region DZ, and the second signal line 50 is disposed on one side of the first opening 121 facing away from the display region AZ.

In one embodiment, through the setting of the second signal line 50 being disposed outside the first opening 121, it can be achieved that the second signal line 50 does not overlap with the first opening 121, and the second signal line 50 is prevented from being exposed by the first opening 121. It should be noted that the distance between an orthographic projection of the second signal line 50 and the orthographic projection of the first opening 121 on the base substrate 11 may be according to practical situations and is not limited herein.

Figure 13:
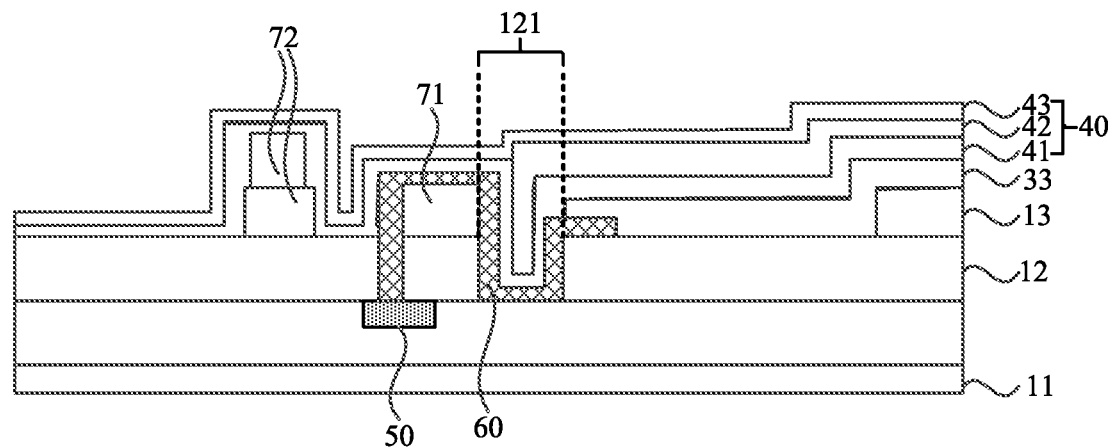
FIG. 13 is a cross-sectional view taken along the section line C-C' in FIG. 12.

FIG. 13 is a cross-sectional view taken along the section line C-C' in FIG. 12. Referring to FIG. 13, In one embodiment, the display panel includes the display region AZ and the non-display region DZ, and the first opening 121 is disposed in the non-display region DZ. The light-emitting element includes the cathode layer 33, and along the direction perpendicular to the base substrate 11, the cathode layer 33 does not overlap with the first opening 121. The display panel further includes a connection electrode layer 60, where the second signal line 50 is electrically connected to the cathode layer 33 through the connection electrode layer 60. The connection electrode layer 60 is connected to the second signal line 50 on the side of the first opening 121 facing away from the display region AZ and is connected to the cathode layer 33 on one side of the first opening 121 closest to the display region AZ.

It is to be understood that the cathode layer 33 is generally made of magnesium-aluminum alloy and thus is also easily corroded by water and oxygen when exposed, so that through the setting of the cathode layer 33 not overlapping with the first opening 121, the cathode layer 33 can be prevented from being corroded by water and oxygen. The second signal line 50 and the cathode layer 33 are respectively disposed on two sides of the first opening 121, and through the setting of the connection electrode layer 60 being connected to the second signal line 50 and the cathode layer 33, the electrical connection between the second signal line 50 and the cathode layer 33 can be achieved, so that the PVEE signal can be smoothly transmitted from the second signal line 50 to the cathode layer 33. It should be noted that the shape of an orthographic projection of the connection electrode layer 60 on the base substrate 11 may be according to practical situations and is not limited herein.

Figure 14:
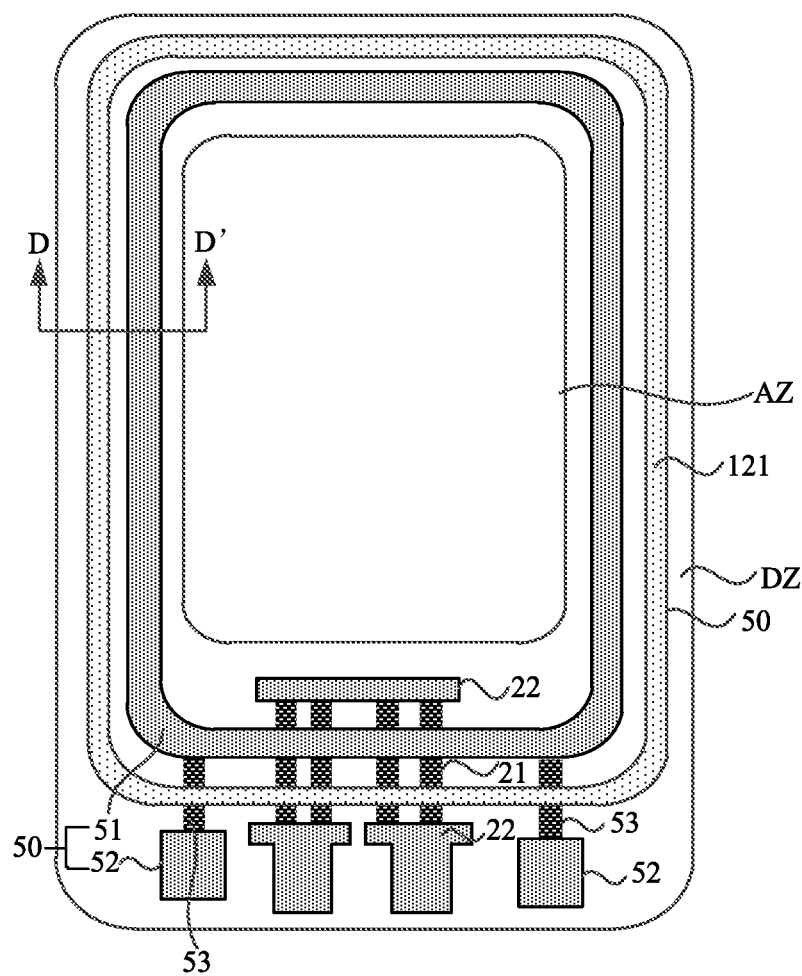
FIG. 14 is a structural diagram of another display panel according to an embodiment of the present disclosure.

FIG. 14 is a structural diagram of another display panel according to an embodiment of the present disclosure. Referring to FIG. 14, In one embodiment, the display panel includes the display region AZ and the non-display region DZ, where the first opening 121 is disposed in the non-display region DZ, the second signal line 50 includes a third sub signal line 51 and a fourth sub signal line 52, the third sub signal line 51 is disposed on the side of the first opening 121 closest to the display region AZ, and the fourth sub signal line 52 is disposed on the side of the first opening 121 facing away from the display region AZ. The display panel further includes a connection line 53, where the third sub signal line 51 is electrically connected to the fourth sub signal line 52 through the connection line 53. The connection line 53 and the first sub signal line 21 are disposed in a same layer, and along the direction perpendicular to the base substrate 11, the connection line 53 at least partially overlaps with the first opening 121.

In one embodiment, the third sub signal line 51 and the fourth sub signal line 52 are respectively disposed on two sides of the first opening 121 and are electrically connected through the connection line 53. Exemplarily, as shown in FIG. 13, when the second signal line 50 is configured to transmit the PVEE signal, the display region AZ is encircled by the third sub signal line 51, so that the cathode layer 33 in the display panel is facilitated to be connected to the third sub signal line 51.

It is to be understood that along the direction perpendicular to the base substrate 11, the third sub signal line 51 does not overlap with the first opening 121, and at the same time, the fourth sub signal line 52 does not overlap with the first opening 121, so that the second signal line 50 can be prevented from being exposed by the first opening 121 and from being corroded by water and oxygen.

It is further to be understood that through the setting of the connected line 53 and the first sub signal line 21 being disposed in a same layer, the connection line 53 can be at least partially covered by the insulating layer between the first sub signal line 21 and the second sub signal line 22, so that the area of the connection line 53 exposed by the first opening 121 can be reduced, and the risk of the connection line 53 to be corroded by water and oxygen can be lowered. It should be noted that the part where an orthographic projection of the connection line 53 on the base substrate 11 overlaps with the orthographic projection of the first opening 121 on the base substrate 11 is recorded as an exposed signal segment, and the area of the exposed signal segment covered by the insulating layer between the first sub signal line 21 and the second sub signal line 22 may be according to practical situations and is not limited herein. In one embodiment, the exposed signal segment is completed covered by the insulating layer between the first sub signal line 21 and the second sub signal line 22, so that the connection line 53 can be prevented from being exposed and corroded by water and oxygen.

Figure 15:
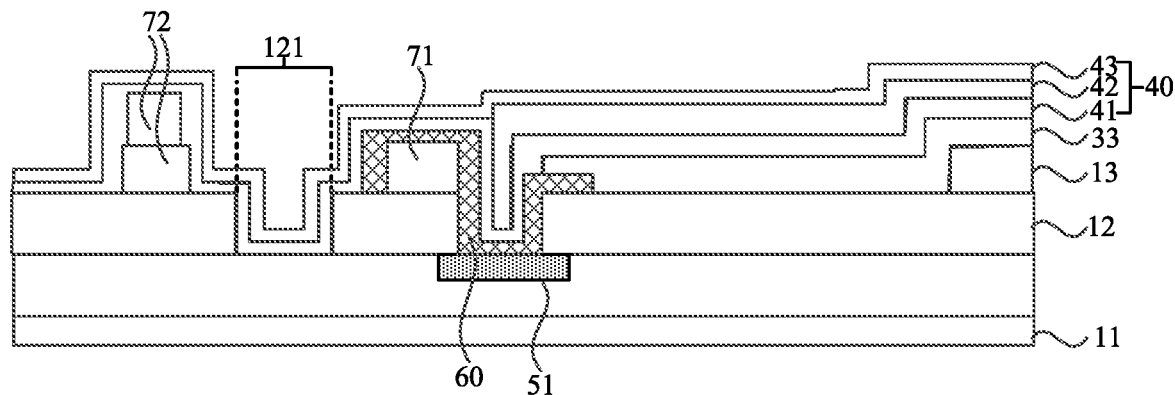
FIG. 15 is a cross-sectional view taken along the section line D-D' in FIG. 14.

FIG. 15 is a cross-sectional view taken along the section line D-D' in FIG. 14. Referring to FIG. 15, In one embodiment, the light-emitting element includes the cathode layer 33, and along the direction perpendicular to the base substrate 11, the cathode layer 33 does not overlap with the first opening 121. The display panel further includes the connection electrode layer 60, where the third signal line 51 is electrically connected to the cathode layer 33 through the connection electrode layer 60.

It is to be understood that the third sub signal line 51 and the cathode layer 33 are generally not disposed in a same layer, and through the setting of the connection electrode layer 60 being connected to the third sub signal line 51 and the cathode layer 33, the electrical connection between the second signal line 50 and the cathode layer 33 can be achieved, so that the PVEE signal is smoothly transmitted from the second signal line 50 to the cathode layer 33. It should be noted that the shape of the orthographic projection of the connection electrode layer 60 on the base substrate 11 may be according to practical situations and is not limited herein. It should be noted that along the direction perpendicular to the base substrate 11, the connection electrode layer 60 may overlap with the first opening 121 and may not overlap with the first opening 121, which is not limited herein.

Figure 16:
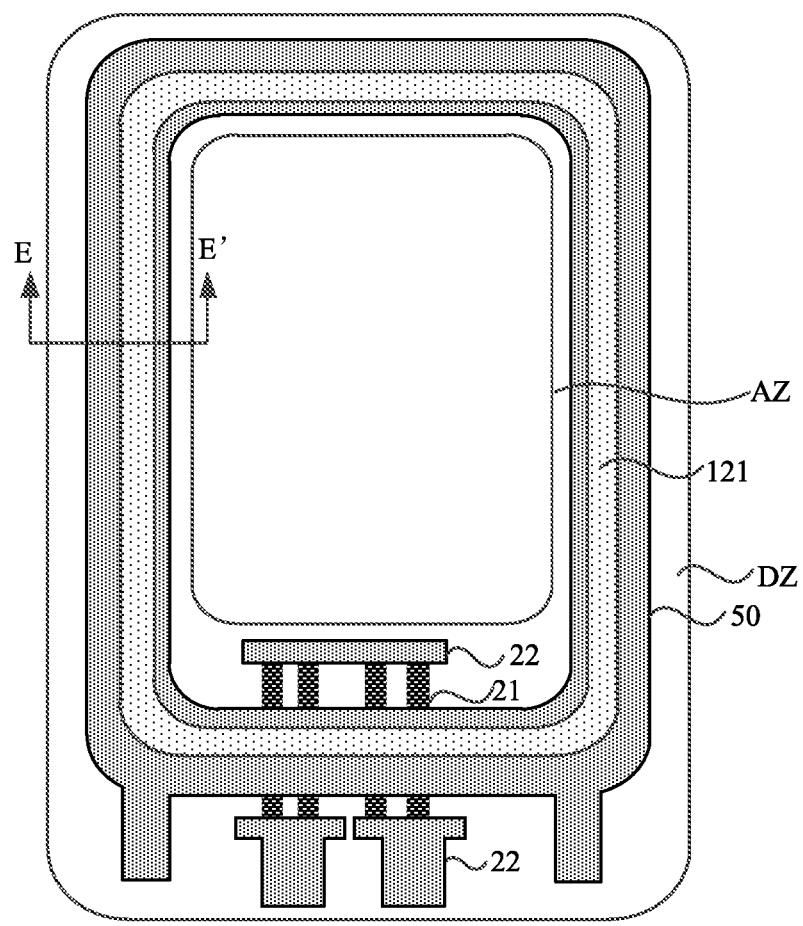
FIG. 16 is a structural diagram of another display panel according to an embodiment of the present disclosure.

FIG. 16 is a structural diagram of another display panel according to an embodiment of the present disclosure. Referring to FIG. 16, In one embodiment, along the direction perpendicular to the base substrate 11, the second signal line 50 at least partially overlaps with the first opening 121, and any side edge of the second signal line 50 does not overlap with the first opening 121.

In one embodiment, along the direction perpendicular to the base substrate 11, the degree of overlapping between the second signal line 50 and the first opening 121 may be according to practical situations and is not limited herein. It is to be understood that the greater the degree of overlapping between the second signal line 50 and the first opening 121, the smaller the area of the non-display region DZ occupied by the second signal line 50 and the first opening 121, and the more conducive to achieving a narrow border.

In one embodiment, the second signal line 50 may be made of titanium aluminum titanium material with a small sheet resistance value, that is, the second sub signal line 50 includes three layers, two film layers of titanium sandwiching one film layer of aluminum, so that the resistance of the second signal line 50 can be reduced, and the signal loss can be lowered. Aluminum is more easily corroded by water and oxygen than titanium, so that through the setting of any side edge of the second signal line 50 not overlapping with the first opening 121, aluminum can be prevented from being exposed, and the risk of the second signal line 50 to be corroded by water and oxygen can be reduced. It should be noted that the distance between an orthographic projection of each side edge of the second signal line 50 and the orthographic projection of the first opening 121 on the base substrate 11 may be according to practical situations and is not limited herein.

Still referring to FIG. 16, In one embodiment, along the direction perpendicular to the base substrate 11, the orthographic projection of the first opening 121 on the base substrate 11 is located within the orthographic projection of the second signal line 50 on the base substrate 11.

It is to be understood that along the direction perpendicular to the base substrate 11, through the setting of the orthographic projection of the first opening 121 on the base substrate 11 being located within the orthographic projection of the second signal line 50 on the base substrate 11, it is not necessary to reserve a region in the non-display region DZ for disposing the first opening 121, the area of the non-display region DZ is facilitated to be reduced, and thus the screen ratio is improved.

Figure 17:
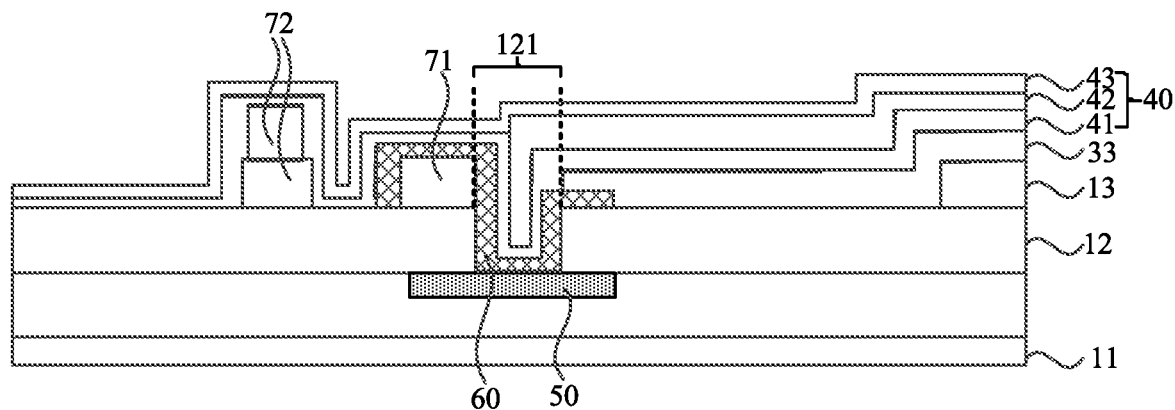
FIG. 17 is a cross-sectional view taken along the section line E-E' in FIG. 16.

FIG. 17 is a cross-sectional view taken along the section line E-E' in FIG. 16. Referring to FIG. 17, In one embodiment, the display panel includes the display region AZ and the non-display region DZ, and the first opening 121 is disposed in the non-display region DZ. The light-emitting element includes the cathode layer 33, and along the direction perpendicular to the base substrate 11, the cathode layer 33 does not overlap with the first opening 121. The display panel further includes the connection electrode layer 60, where the second signal line 50 is electrically connected to the cathode layer 33 through the connection electrode layer 60. The connection electrode layer 60 is connected to the second signal line 50 on a position where the first opening 121 is located and is connected to the cathode layer 33 on the side of the first opening 121 closest to the display region AZ.

It is to be understood that the cathode layer 33 the second signal line 50 and are generally disposed in different film layers, and through the setting of the connection electrode layer 60 being connected to the second signal line 50 and the cathode layer 33, the electrical connection between the second signal line 50 and the cathode layer 33 can be achieved, so that the PVEE signal can be smoothly transmitted from the second signal line 50 to the cathode layer 33. It is further to be understood that through the setting of the connection electrode layer 60 being connected to the second signal line 50 on the position where the first opening 121 is located, the connection between the second signal line 50 and the cathode layer 33 can be achieved without the need of additionally punching a hole, so that the manufacturing process of the display panel is facilitated to be simplified and the cost is lowered. It should be noted that the shape of the orthographic projection of the connection electrode layer on the base substrate 11 may be according to practical situations and is not limited herein.

Figure 18:
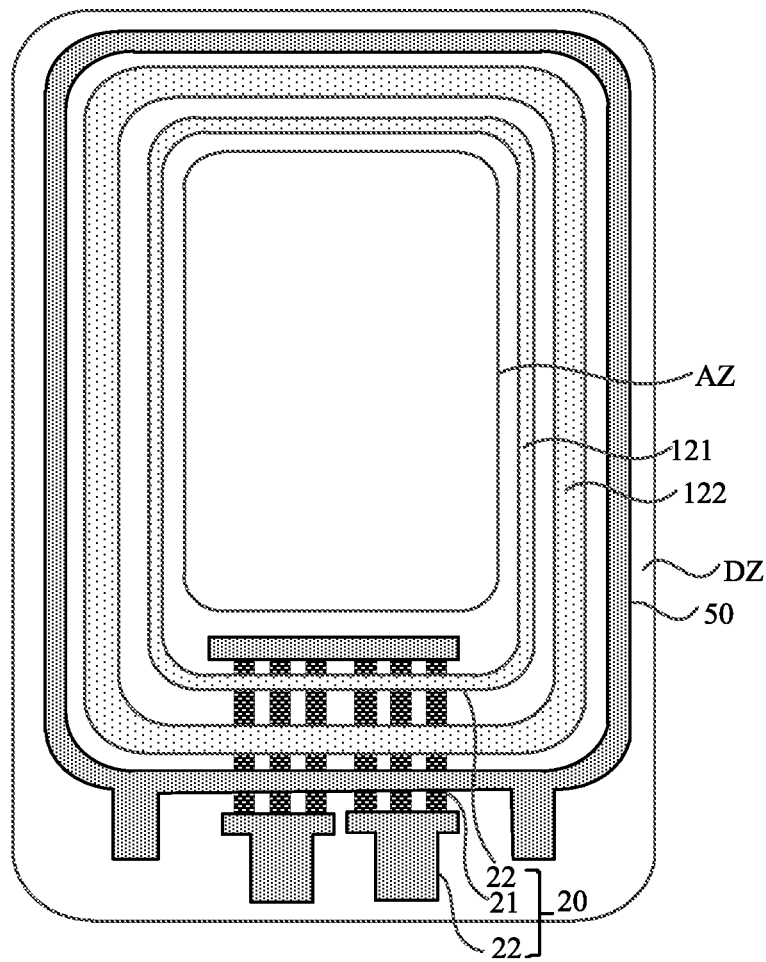
FIG. 18 is a structural diagram of a display panel according to an embodiment of the present disclosure.
Figure 19:
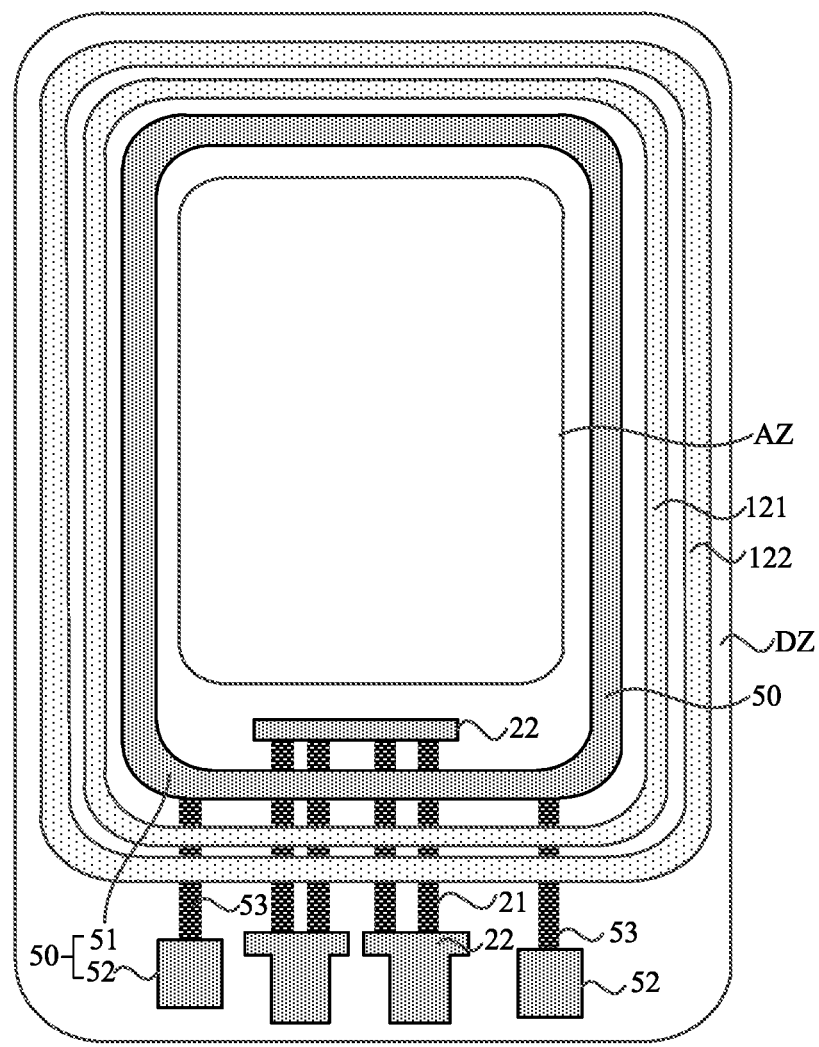
FIG. 19 is a structural diagram of another display panel according to an embodiment of the present disclosure.
Figure 20:
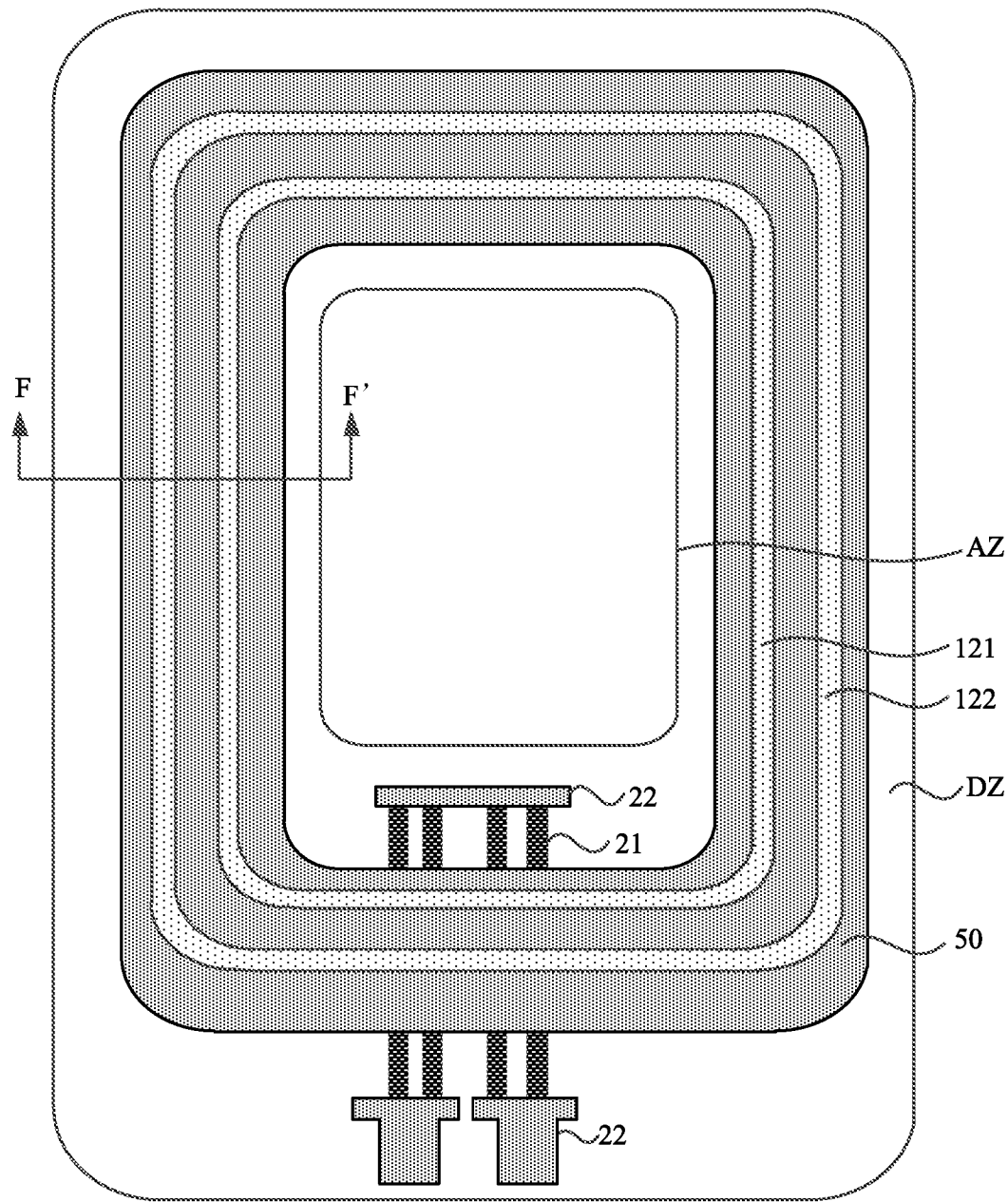
FIG. 20 is a structural diagram of another display panel according to an embodiment of the present disclosure.

FIG. 18 is a structural diagram of a display panel according to an embodiment of the present disclosure. FIG. 19 is a structural diagram of another display panel according to an embodiment of the present disclosure. FIG. 20 is a structural diagram of another display panel according to an embodiment of the present disclosure. Referring to FIGS. 18 to 20, In one embodiment, the display panel further includes a second opening 122 which is disposed on the side of the first opening 121 facing away from the display region AZ. Along the direction perpendicular to the base substrate 11, the second signal line 50 does not overlap with the second opening 122; or along the direction perpendicular to the base substrate 11, the second signal line 50 at least partially overlaps with the second opening 122, and any side edge of the second signal line 50 does not overlap with the second opening 122.

In one embodiment, along the direction perpendicular to the base substrate 11, the second signal line 50 not overlapping with the second opening 122 may be achieved through a plurality of specific implementations, which may be according to practical situations and are not limited herein. Typical examples are described below. Exemplarily, referring to FIG. 18, the second opening 122 is disposed in the non-display region DZ, and the second signal line 50 is disposed on one side of the second opening 122 facing away from the display region AZ. Exemplarily, referring to FIG. 19, In one embodiment, the second signal line 50 includes the third sub signal line 51 and the fourth sub signal line 52, the third sub signal line 51 is disposed on one side of the second opening 122 closest to the display region AZ, and the fourth sub signal line 52 is disposed on the side of the second opening 122 facing away from the display region AZ. The display panel further includes the connection line 53, where the third sub signal line 51 is electrically connected to the fourth sub signal line 52 through the connection line 53. The connection line 53 and the first sub signal line 21 are disposed in a same layer, and along the direction perpendicular to the base substrate 11, the connection line 53 at least partially overlaps with the second opening 122. It is to be noted that FIG. 19 only exemplarily illustrates that the third sub signal line 51 is disposed on the side of the first opening 121 closest to the display region AZ but not limits the present disclosure, and in other implementations, the third sub signal line 51 may further be disposed between the first opening 121 and the second opening 122.

It is to be understood that along the direction perpendicular to the base substrate 11, through the setting of the second signal line 50 not overlapping with the second opening 122, the second signal line 50 can be prevented from being exposed by the second opening 122 and from being corroded by water and oxygen, so that the yield of the display panel is facilitated to be improved.

In one embodiment, along the direction perpendicular to the base substrate 11, when the second signal line 50 at least partially overlaps with the second opening 122, the degree of overlapping between the second signal line 50 and the second opening 122 may be according to practical situations and is not limited herein. It is to be understood that the greater the degree of overlapping between the second signal line 50 and the second opening 122, the smaller the area of the non-display region DZ occupied by the second signal line 50 and the second opening 122, and the more conducive to achieving a narrow border. In one embodiment, referring to FIG. 20, along the direction perpendicular to the base substrate 11, an orthographic projection of the second opening 122 on the base substrate 11 is located within the orthographic projection of the second signal line 50 on the base substrate 11. Thus, it is not necessary to reserve a region in the non-display region DZ for disposing the second opening 122, the area of the non-display region DZ is facilitated to be reduced, and thus the screen ratio is improved.

It is to be understood that the second signal line 50 may adopt the titanium aluminum titanium material with a small sheet resistance value, so that the resistance of the second signal line 50 can be reduced, and the signal loss can be lowered. Aluminum is more easily corroded by water and oxygen than titanium, so that through the setting of any side edge of the second signal line 50 not overlapping with the second opening 122, aluminum can be prevented from being exposed, and the risk of the second signal line 50 to be corroded by water and oxygen can be reduced. It should be noted that the distance between the orthographic projection of each side edge of the second signal line 50 and the orthographic projection of the second opening 122 on the base substrate 11 may be according to practical situations and is not limited herein.

It is further to be understood that the setting of the planarization layer 12 further including the second opening 122 adds a barrier for blocking the transmission of water and oxygen from the non-display region DZ to the display region AZ, improving the capability of the display panel to block water and oxygen. It should be noted that FIGS. 18 to 20 only exemplarily illustrate that the second opening 122 surrounds a circle of the display region AZ but not limit the embodiments of the present disclosure. In one embodiment, in other implementations, the second opening 122 may further be disposed half around the display region AZ.

Figure 21:
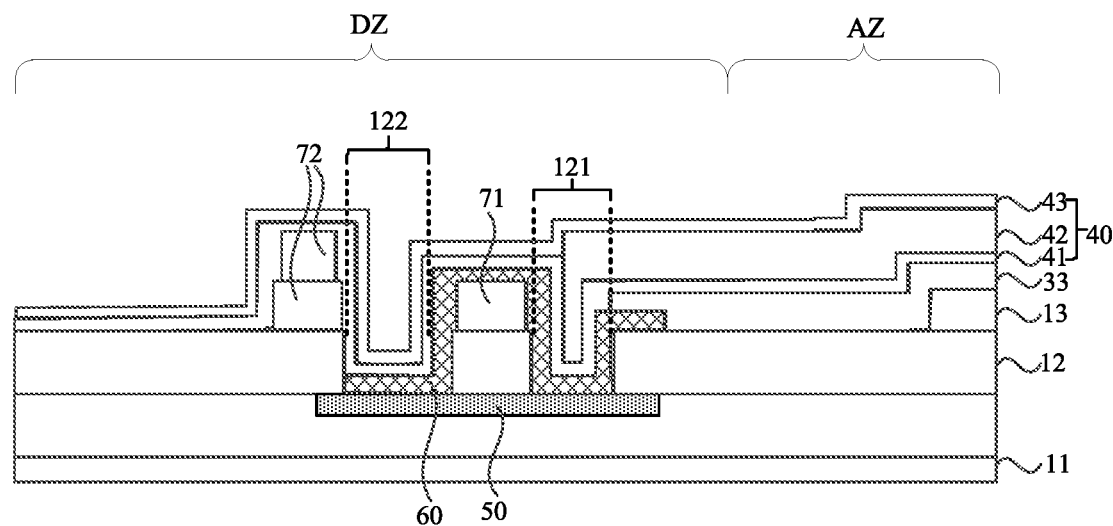
FIG. 21 is a cross-sectional view taken along the section line F-F' in FIG. 20.

FIG. 21 is a cross-sectional view taken along the section line F-F' in FIG. 20. Referring to FIG. 21, In one embodiment, along the direction perpendicular to the base substrate 11, the second signal line 50 at least partially overlaps with the second opening 122, and any side edge of the second signal line 50 does not overlap with the second opening 122. The connection electrode layer 60 is connected to the second signal line 50 on a position where the second opening 122 is located.

It is to be understood that through the setting of the connection electrode layer 60 being connected to the second signal line 50 on the position where the second opening 122 is located, the contact area of the second signal line 50 and the cathode layer 33 can be increased, and the quality of electrical connection between the second signal line 50 and the cathode layer 33 can be improved.

Still referring to FIG. 21, In one embodiment, a first barrier wall 71 is disposed between the first opening 121 and the second opening 122, and the first barrier wall 71 and the pixel spacer layer 13 are disposed in a same layer.

In one embodiment, the first barrier wall 71 is configured to block the organic layer 42 in the encapsulation layer 40 from continuously spreading along the direction from the display region AZ to the non-display region DZ. For the region of the non-display region DA located on one side of the first barrier wall 71 facing away from the display region AZ, when the encapsulation layer 40 is covered, the region does not cover the organic layer 42 due to the action of the first barrier wall 71, so that external water and oxygen do not spread from the encapsulation layer 40 to the display region AZ, and the planarization layer 12 is broken at the second opening 122 due to the action of the first opening 121 and the second opening 122, so that external water and oxygen do not spread from the planarization layer 12 to the display region AZ either. It can be seen that the first barrier wall 71, the first opening 121 and the second opening 122 help reduce the possibility of intrusion of external water and oxygen into the display region AZ and enhance the capacity of the display panel to block water and oxygen.

It is to be understood that through the setting of the first barrier wall 71 and the pixel spacer layer 13 being disposed in a same layer, it is not necessary to additionally add a process for manufacturing the first barrier wall 71, so that the manufacturing process of the display panel can be simplified and the cost is lowered.

Figure 22:
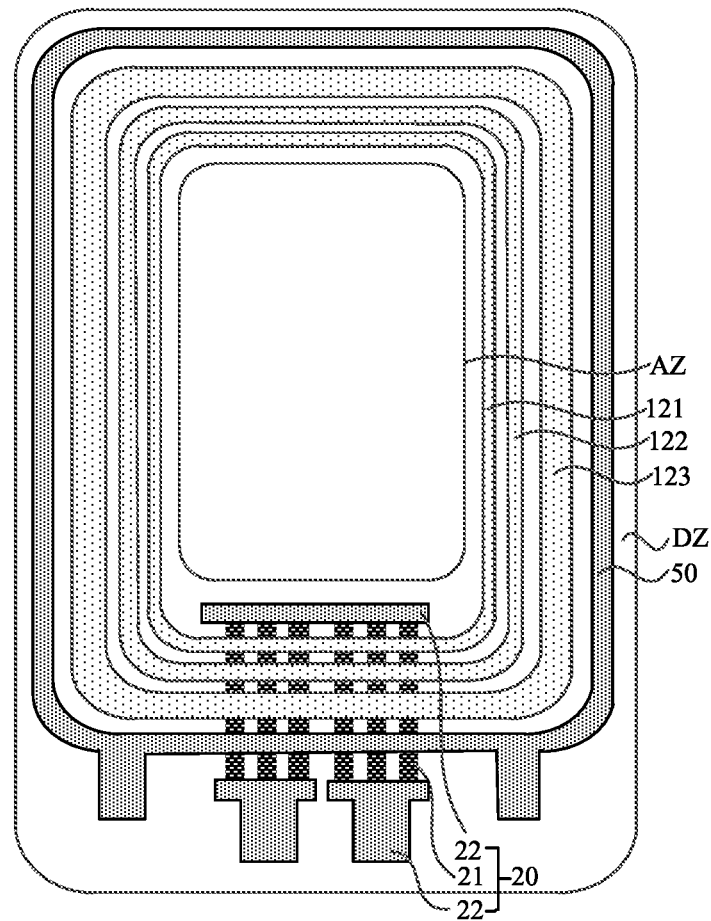
FIG. 22 is a structural diagram of another display panel according to an embodiment of the present disclosure.

FIG. 22 is a structural diagram of another display panel according to an embodiment of the present disclosure. Referring to FIG. 22, In one embodiment, the display panel further includes a third opening 123 which is disposed on the side of the second opening 122 facing away from the display region AZ, where along a direction from the non-display region DZ to the display region AZ, a width of the third opening 123 is greater than a width of the second opening 122 and a width of the first opening 121.

It is to be understood that the setting of the planarization layer 12 further including the third opening 123 may further add a barrier for blocking the transmission of water and oxygen from the non-display region DZ to the display region AZ, improving the capability of the display panel to block water and oxygen.

It is further to be understood that process fluctuations exist during the actual manufacturing process, the greater the width of the openings provided in the planarization layer 12, the less the risk of the openings not penetrating through the planarization layer 12 due to the process fluctuations, and the greater the capability to block water and oxygen. Therefore, along the direction from the non-display region DZ to the display region AZ, setting the width of the third opening 123 to be greater than the width of the second opening 122 and the width of the first opening 121 is equivalent to disposing the opening with the strongest blocking capability closest to the starting point of water and oxygen intrusion, so that water and oxygen can be strongly blocked as early as possible, and the impact of water and oxygen intrusion into the display panel on other devices can be avoided.

Figure 23:
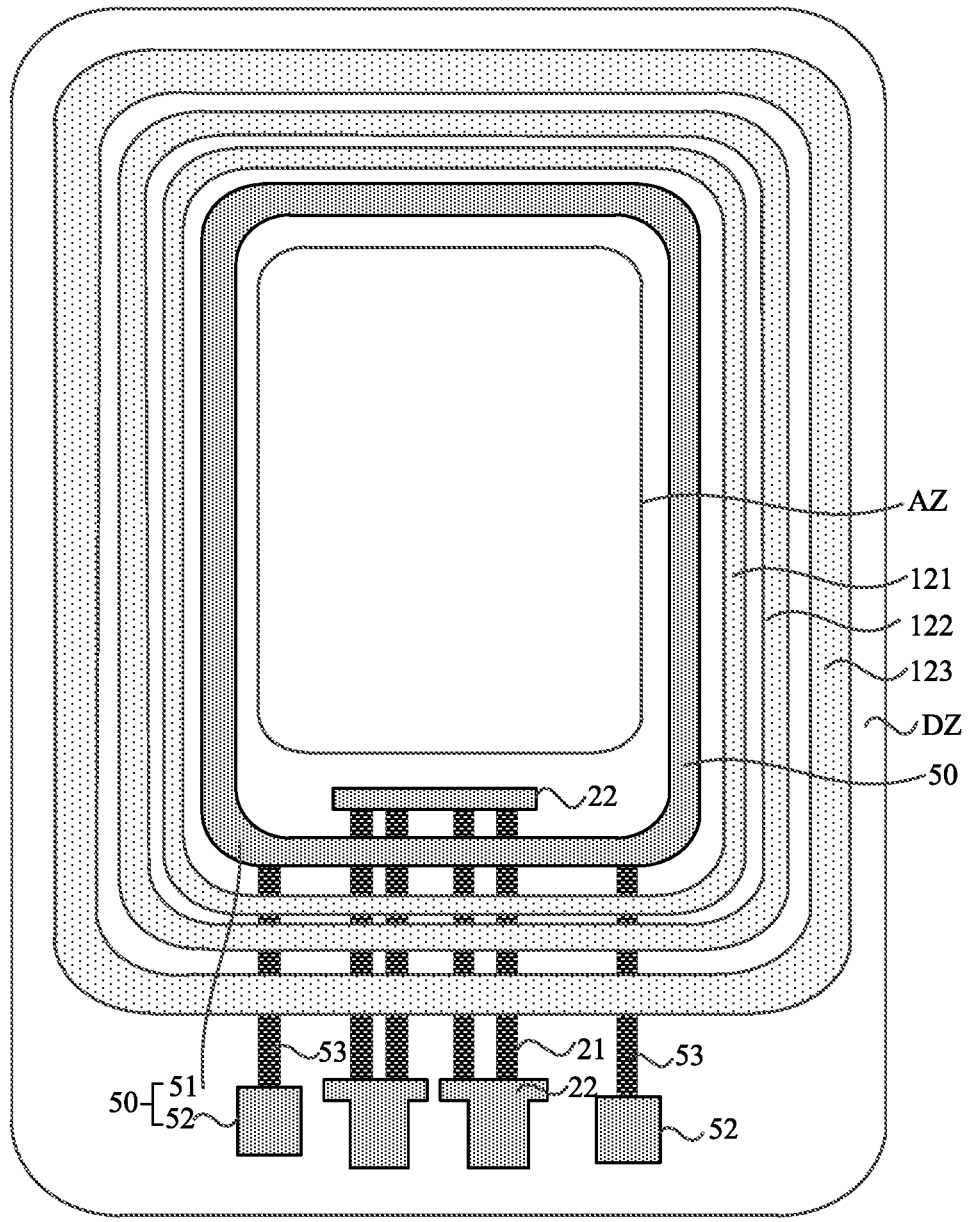
FIG. 23 is a structural diagram of a display panel according to an embodiment of the present disclosure.
Figure 24:
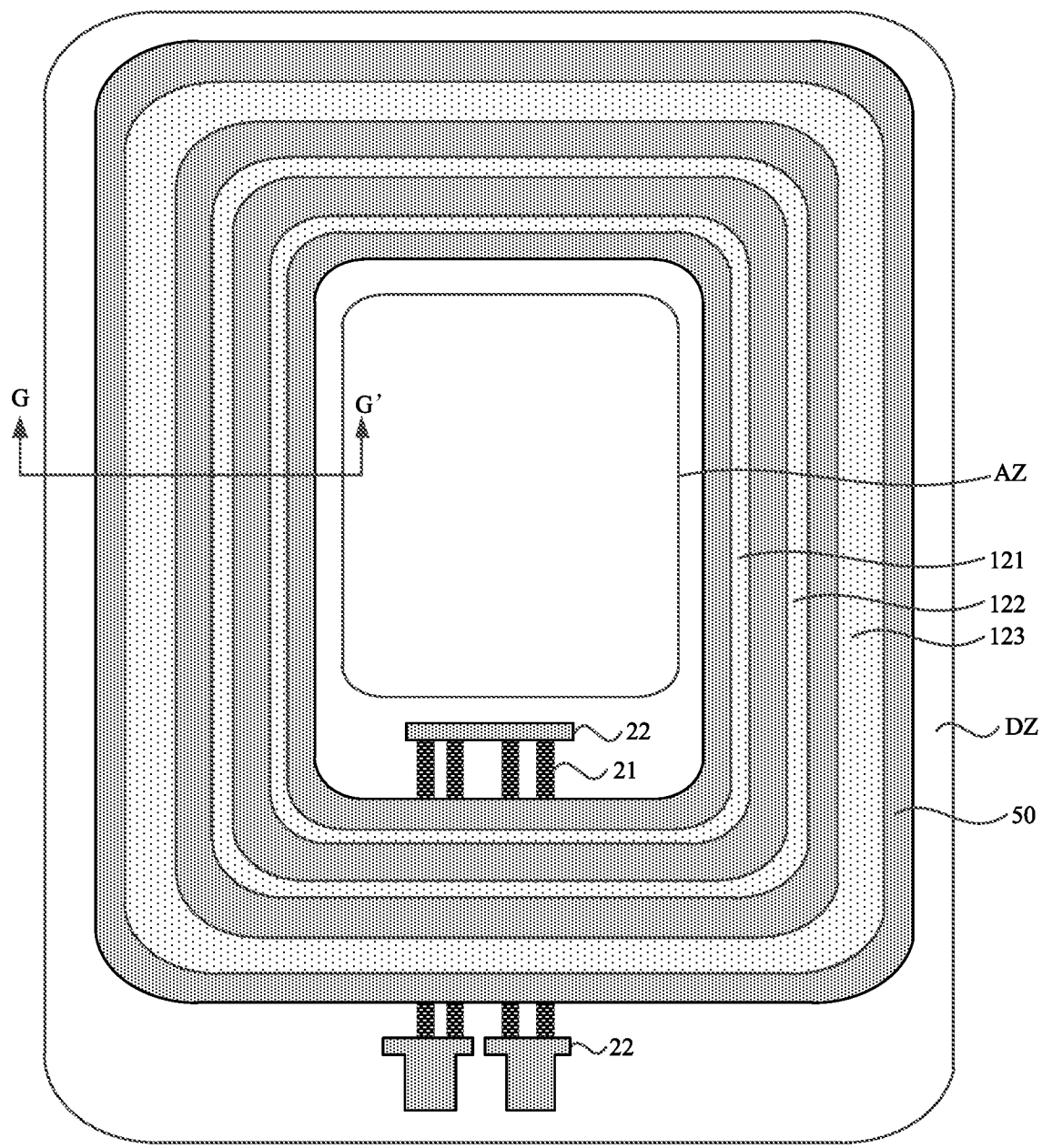
FIG. 24 is a structural diagram of another display panel according to an embodiment of the present disclosure.

FIG. 23 is a structural diagram of a display panel according to an embodiment of the present disclosure. FIG. 24 is a structural diagram of another display panel according to an embodiment of the present disclosure. Referring to FIGS. 22 to 24, In one embodiment, along the direction perpendicular to the base substrate 11, the second signal line 50 does not overlap with the third opening 123; or along the direction perpendicular to the base substrate 11, the second signal line 50 at least partially overlaps with the third opening 123, and any side edge of the second signal line 50 does not overlap with the third opening 123.

In one embodiment, along the direction perpendicular to the base substrate 11, the second signal line 50 not overlapping with the third opening 123 may be achieved through a plurality of specific implementations, which may be according to practical situations and are not limited herein. Typical examples are described below. Exemplarily, referring to FIG. 22, the third opening 123 is disposed in the non-display region DZ, and the second signal line 50 is disposed on one side of the third opening 123 facing away from the display region AZ. Exemplarily, referring to FIG. 23, the second signal line 50 includes the third sub signal line 51 and the fourth sub signal line 52, the third sub signal line 51 is disposed on the side of the first opening 121 closest to the display region AZ, and the fourth sub signal line 52 is disposed on the side of the third opening 123 facing away from the display region AZ. The display panel further includes the connection line 53, where the third sub signal line 51 is electrically connected to the fourth sub signal line 52 through the connection line 53. The connection line 53 and the first sub signal line 21 are disposed in a same layer, and along the direction perpendicular to the base substrate 11, the connection line 53 at least partially overlaps with the first opening 121 and the third opening 123. It is to be noted that FIG. 23 only exemplarily illustrates that the third sub signal line 51 is disposed on the side of the first opening 121 closest to the display region AZ but not limits the present application, and in other implementations, the third sub signal line 51 may further be disposed between the first opening 121 and the second opening 122, or be disposed between the second opening 122 and the third opening 123.

It is to be understood that along the direction perpendicular to the base substrate 11, through the setting of the second signal line 50 not overlapping with the third opening 123, the second signal line 50 can be prevented from being exposed by the third opening 123 and from being corroded by water and oxygen, so that the yield of the display panel is facilitated to be improved.

In one embodiment, along the direction perpendicular to the base substrate 11, when the second signal line 50 at least partially overlaps with the third opening 123, the degree of overlapping between the second signal line 50 and the third opening 123 may be according to practical situations and is not limited herein. It is to be understood that the greater the degree of overlapping between the second signal line 50 and the third opening 123, the smaller the area of the non-display region DZ occupied by the second signal line 50 and the third opening 123, and the more conducive to achieving a narrow border. In one embodiment, referring to FIG. 24, along the direction perpendicular to the base substrate 11, an orthographic projection of the third opening 123 on the base substrate 11 is located within the orthographic projection of the second signal line 50 on the base substrate 11. Thus, it is not necessary to reserve a region in the non-display region DZ for disposing the third opening 123, the area of the non-display region DZ is facilitated to be reduced, and thus the screen ratio is improved.

It is to be understood that the second signal line 50 may adopt the titanium aluminum titanium material with a small sheet resistance value, so that the resistance of the second signal line 50 can be reduced, and the signal loss can be lowered. Aluminum is more easily corroded by water and oxygen than titanium, so that through the setting of any side edge of the second signal line 50 not overlapping with the third opening 123, aluminum can be prevented from being exposed, and the risk of the second signal line 50 to be corroded by water and oxygen can be reduced. It should be noted that the distance between the orthographic projection of each side edge of the second signal line 50 and the orthographic projection of the third opening 123 on the base substrate 11 may be according to practical situations and is not limited herein.

It is further to be understood that the setting of the planarization layer 12 further including the third opening 123 may further add a barrier for blocking the transmission of water and oxygen from the non-display region DZ to the display region AZ, improving the capability of the display panel to block water and oxygen. It should be noted that FIGS. 22 to 24 only exemplarily illustrate that the third opening 123 surrounds a circle of the display region AZ but not limit the embodiments of the present disclosure. In one embodiment, in other implementations, the third opening 123 may further be disposed half around the display region AZ.

It should be noted that the shapes of the second opening 122 and the third opening 123 may be disposed with reference to the shape of the first opening 121, which is not repeated herein and may be understood with reference to the foregoing.

Figure 25:
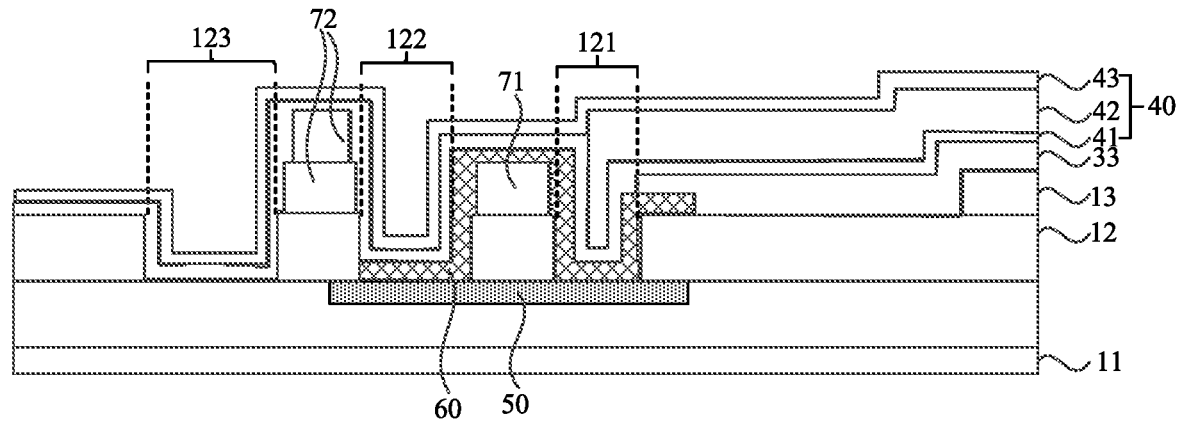
FIG. 25 is a cross-sectional view taken along the section line G-G' in FIG. 24.

FIG. 25 is a cross-sectional view taken along the section line G-G' in FIG. 24. Referring to FIG. 25, In one embodiment, a second barrier wall 72 is disposed between the second opening 122 and the third opening 123, and at least part of the second barrier wall 72 and the pixel spacer layer 13 are disposed in a same layer.

In one embodiment, the second barrier wall 72 is configured to block the organic layer 42 in the encapsulation layer 40 from continuously spreading along the direction from the display region AZ to the non-display region DZ. When the encapsulation layer 40 is covered, due to the action of the second barrier wall 72, the region of the non-display region DZ located on one side of the second barrier wall 72 facing away from the display region AZ does not cover the organic layer 42, so that external water and oxygen do not spread from the encapsulation layer 40 to the display region AZ, and the planarization layer 12 is broken at the second opening 122 due to the action of the first opening 121, the second opening 121 and the third opening 123, so that external water and oxygen do not spread from the planarization layer 12 to the display region AZ either. It can be seen that the combined action of the first barrier wall 72, the first opening 121, the second opening 122 and the third opening greatly reduces the possibility of intrusion of external water and oxygen into the display region AZ and enhance the capacity of the display panel to block water and oxygen.

It is to be understood that through the setting of at least part of the second barrier wall 72 and the pixel spacer layer 13 being disposed in a same layer, the part of the second barrier wall 72 disposed in the same layer as the pixel spacer layer 13 can be formed by a same manufacturing process as the pixel spacer layer 13, so that the manufacturing process of the second barrier wall 72 is facilitated to be simplified and the cost of the display panel is lowered.

Still referring to FIG. 25, In one embodiment, along the direction perpendicular to the base substrate 11, a height of the second barrier wall 72 is greater than a height of the pixel spacer layer 13.

It is to be understood that through the setting of the height of the second barrier wall 72 greater than the height of the pixel spacer layer 12, the height of the second barrier wall 72 may be relatively high, so that the capability of the second barrier wall 72 to block the organic layer 42 becomes relatively strong. In addition, when the display panel is covered by a cover, the second barrier wall 72 may further serve as a support.

Still referring to FIG. 12, FIG. 14, FIG. 16, FIGS. 18 to 20 and FIGS. 22 to 24, In one embodiment, the first signal line 20 provides a first power signal for a pixel circuit of the display panel, the second signal line 50 provides a second power signal for the light-emitting element of the display panel, one of the first power signal and the second power signal is a logic high level signal, and the other of the first power signal and the second power signal is a logic low level signal.

In one embodiment, the first power signal, i.e., the PVDD signal, provides a signal for the anode of the light-emitting element, and the second power signal, i.e., the PVEE signal, provides a signal for the cathode of the light-emitting element.

It should be noted that for the convenience of drawing, the part of the first signal line 20 extending to the display region AZ is not shown in FIG. 12, FIG. 14, FIG. 16, FIGS. 18 to 20 and FIGS. 22 to 24, which may be understood by those having ordinary skill in the art and is not repeated herein.

Figure 26:
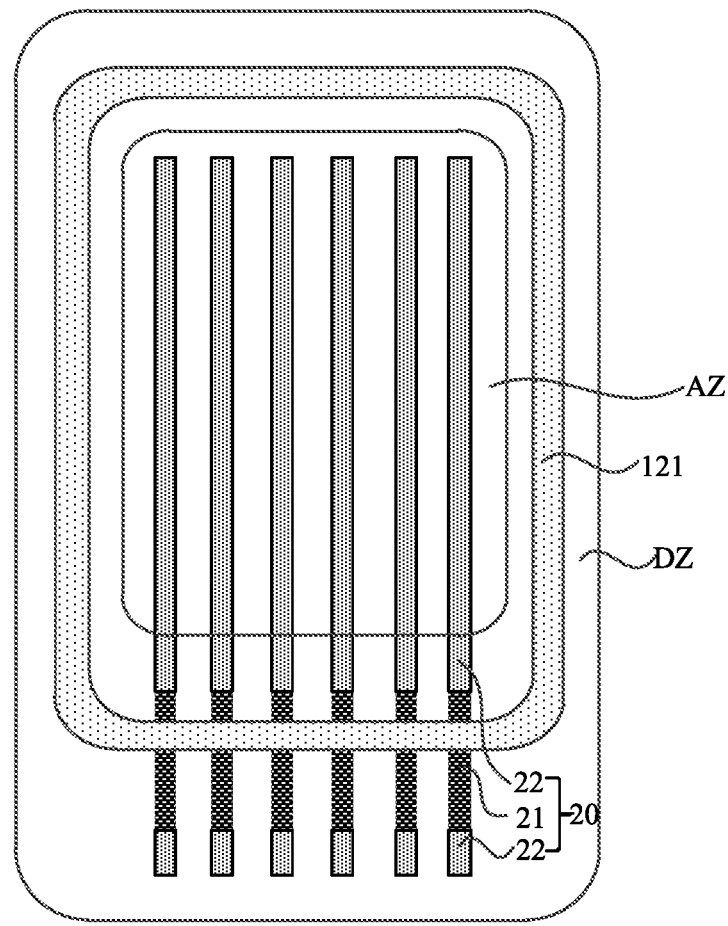
FIG. 26 is a structural diagram of another display panel according to an embodiment of the present disclosure.

FIG. 26 is a structural diagram of another display panel according to an embodiment of the present disclosure. Referring to FIG. 26, In one embodiment, the first signal line 20 is configured to provide the data signal to the pixel circuit of the display panel.

In one embodiment, the data signal, i.e., a Vdata signal, determines the magnitude of the drive current flowing through the light-emitting element and further determines the brightness of the light-emitting element.

Still referring to FIGS. 4 to 11, In one embodiment, the display panel includes a first transistor 80 and a second transistor 90. The first transistor 80 includes a first gate electrode 81, a first source electrode 82, a first drain electrode 83 and a first active layer 84. The second transistor 90 includes a second gate electrode 91, a second source electrode 92, a second drain electrode 93 and a second active layer 94. The first active layer 84 includes an oxide semiconductor, the second active layer 94 includes silicon, and the first active layer 84 is disposed on one side of the second active layer 94 facing away from the base substrate 11. The second sub signal line 22 is disposed in a same layer as at least one of the first source electrode 82, the first drain electrode 83, the second source electrode 92 or the second drain electrode 93.

In one embodiment, the specific material of the first active layer 84 may be according to practical situations and is not limited herein. Exemplarily, the material of the first active layer 84 may be indium gallium zinc oxide, etc. In one embodiment, the specific materials of the first gate electrode 81, the second gate electrode 91, the first source electrode 82, the first drain electrode 83, the second source electrode 92 and the second drain electrode 93 may be according to practical situations and are not limited herein. Exemplarily, the materials of the first gate electrode 81 and the second gate electrode 91 may be molybdenum, titanium aluminum titanium, etc. The materials of the first source electrode 82, the first drain electrode 83, the second source electrode 92 and the second drain electrode 93 may be molybdenum aluminum molybdenum, titanium aluminum titanium, etc. It should be noted that each of the structures in the first transistor 80 and the second transistor 90 may be formed by physical vapor deposition, chemical vapor deposition, inkjet printing or other methods, and the forming way of each structure may be set according to the actual requirements of the manufacturing method of the display panel and is not limited herein.

In one embodiment, the first transistor 80 and the second transistor 90 may be a top gate structure or a bottom gate structure and are not limited herein. In one embodiment, the relative positional relationships of the first source electrode 82, the first drain electrode 83, the second source electrode 92 and the second drain electrode 93 are various and may be according to practical situations and are not limited herein. Exemplarily, the first source electrode 82 and the first drain electrode 83 are disposed in a same layer, the second source electrode 92 and the second drain electrode 93 are disposed in a same layer, and the first drain electrode 83 and the second drain electrode 93 may be disposed in a same layer or may be disposed in different layers. In one embodiment, the first source electrode 82, the first drain electrode 83, the second source electrode 92 and the second drain electrode 93 are disposed in a same layer (as shown in FIGS. 4 to 11), so that the first source electrode 82, the first drain electrode 83, the second source electrode 92 and the second drain electrode 93 can be formed by a same process, the process is facilitated to be simplified, and the display panel is facilitated to be thin.

In one embodiment, the material of the second sub signal line 22 may be according to practical situations and is not limited herein. Exemplarily, the material of the second sub signal line 22 may be titanium aluminum titanium, molybdenum aluminum, etc. In one embodiment, the second sub signal line may adopt the titanium aluminum titanium material with a small sheet resistance value, so that the resistance of the second sub signal line 22 can be relatively small, and the signal loss can be lowered.

Still referring to FIGS. 4 to 11, In one embodiment, the first gate electrode 81 is disposed on one side of the second gate electrode 91 facing away from the base substrate 11.

In one embodiment, when the first active layer 84 is disposed on the side of the second active layer 94 facing away from the base substrate 11, the first gate electrode 81 is disposed on the side of the second gate electrode 91 facing away from the base substrate 11, and the first source electrode 82, the first drain electrode 83, the second source electrode 92 and the second drain electrode 93 are disposed in a same layer, through the setting of the first gate electrode 81 being disposed on the side of the second gate 91 facing away from the base substrate 11, the depth of a via hole in the first transistor 80 may be made relatively shallow, and the process requirements are relatively low. Herein and hereinafter, via holes in the transistor refer to the via holes for connecting the first active layer 84 and the first source electrode 82, the via holes for connecting the first active layer 84 and the first drain electrode 83, the via holes for connecting the second active layer 94 and the second source electrode 92 and the via holes for connecting the second active layer 94 and the second drain electrode 93, such as the third via hole 430 in FIG. 7.

Still referring to FIG. 4, FIG. 6, FIG. 7 and FIG. 9, In one embodiment, the first sub signal line 21 is disposed on one side of the first active layer 84 facing away from the base substrate 11.

In one embodiment, the material of the first sub signal line 21 may be according to practical situations and is not limited herein. Exemplarily, the material of the first sub signal line 21 may be titanium aluminum titanium, molybdenum aluminum molybdenum, etc. In one embodiment, the first sub signal line 21 may adopt the titanium aluminum titanium material with a small sheet resistance value, so that the resistance of the first sub signal line 21 can be relatively small, and the signal loss is facilitated to be lowered.

It is to be understood that when the first active layer 84 is disposed on the side of the second active layer 94 facing away from the base substrate 11, and the first source electrode 82, the first drain electrode 83, the second source electrode 92 and the second drain electrode 93 are disposed in a same layer, the depth of the via hole in the first transistor 80 is made relatively shallow, and the depth of a via hole in the second transistor 90 is made relatively deep. Through the setting of the first sub signal line 21 being disposed on the side of the first active layer 84 facing away from the base substrate 11, the depth of the via hole (for example, the first via hole 410 and the second via hole 420 in FIG. 7) used to connect the second sub signal line 22 and the first sub signal line 21 is made relatively shallow, so that the signal loss of the first signal line 20 due to the via hole is minimized, and if the via hole is made relatively shallow, the process requirements can be relatively low, and the process is facilitated to be simplified.

Still referring to FIG. 4, FIG. 6, FIG. 7 and FIG. 9, In one embodiment, the first sub signal line 21 and the first gate electrode 81 are disposed in a same layer.

It is to be understood that through the setting of the first sub signal line 21 and the first gate electrode 81 being disposed in a same layer, the first sub signal line 21 and the first gate electrode 81 can be formed by a same process, the cost is facilitated to be lowered, and the display panel is facilitated to be thin.

Still referring to FIG. 7, FIG. 9 and FIG. 11, In one embodiment, the first transistor 80 further includes a third gate electrode 85, the first gate electrode 81 is disposed on the side of the first active layer 84 facing away from the base substrate 11, and the third gate electrode 85 is disposed on one side of the first active layer 84 facing toward the base substrate 11. The first gate electrode 81 and the third gate electrode 85 are both disposed on one side of the second gate electrode 91 facing away from the base substrate 11, and the first sub signal line 21 is disposed in a same film layer as the first gate electrode 81 or the third gate electrode 85.

In one embodiment, the material of the third gate electrode 85 may be according to practical situations and is not limited herein. Exemplarily, the material of the third gate electrode 85 may be molybdenum, titanium aluminum titanium, etc. It is to be understood that through the setting of the first transistor 80 as a double-gate structure, the leakage current of the first transistor 80 is facilitated to be reduced.

It is to be understood that through the setting of the first sub signal line 21 being disposed in a same film layer as the first gate electrode 81 or the third gate electrode 85, that is, the setting of the first sub signal line 21 being disposed in a same layer as the first gate electrode 81 or the third gate electrode 85 facing toward the first opening 121, the depth of the via hole for connecting the first sub signal line 21 and the second sub signal line 22 can be relatively shallow, the signal loss of the first signal line 20 due to the via hole can be reduced, the process requirements can be relatively low, and the process is facilitated to be simplified.

It is further to be understood that when the first sub signal line 21 is disposed in a same layer as the first gate electrode 81 or the third gate electrode 85 and adopts the titanium aluminum titanium material, since the titanium aluminum titanium material cannot bear high temperature, it is not applicable to perform a high-temperature dehydrogenation step on the second active layer 94 after the via holes for filling the second source electrode 92 and the second drain electrode 93 are formed, thus the performance of the second transistor 90 is slightly worse than the performance of the transistor subjected to the high-temperature dehydrogenation step, and at this time, the first transistor 80 may be selected as a drive transistor in a pixel driving circuit. Generally, in a pixel circuit, a transistor whose gate connected to a scanning signal or a light-emitting control signal is a switch transistor, the transistor other than the switch transistor in the pixel circuit is a drive transistor, the drive transistor is disposed in series on a transmission path of the first power supply signal (the PVDD signal), the data signal is written into a gate of the drive transistor, and the potential of the gate of the drive transistor changes as the data signal is written.

Still referring to FIG. 5 and FIG. 10, In one embodiment, the first sub signal line 21 and the second gate electrode 91 are disposed in a same layer.

It is to be understood that when the second gate electrode 91 is disposed on the side of the second active layer 94 facing away from the base substrate 11, through the setting of the first sub signal line 21 and the second gate electrode 91 being disposed in a same layer, the depth of the via hole for connecting the first sub signal line 21 and the second sub signal line 22 can be made smaller than the depth of the via hole in the second transistor 90, that is, the depth of the via hole for connecting the first sub signal line 21 and the second sub signal line 22 is made relatively shallow, so that the signal loss of the first signal line 20 due to the via hole is facilitated to be reduced, the process requirements can be relatively low, and the process is facilitated to be simplified.

It is further to be understood that when the first sub signal 21 is disposed in a same layer as the second gate electrode 91 and adopts the titanium aluminum titanium material, since the thermal expansion coefficients of titanium and aluminum are different and aluminum is easy to shrink to generate cracks, the performance of the second transistor 90 is slightly worse than a transistor whose second gate electrode 91 adopts molybdenum, and at this time, the second transistor 90 may be selected as the drive transistor.

Figure 27:
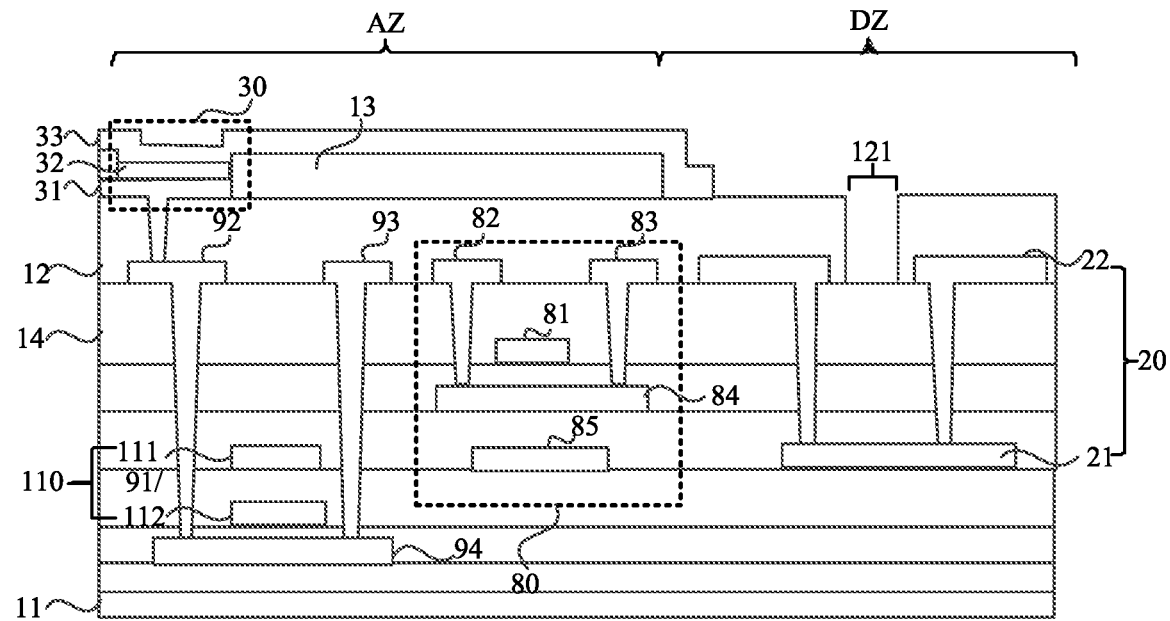
FIG. 27 is a cross-sectional view taken along the section line B-B' in FIG. 3.

FIG. 27 is a cross-sectional view taken along the section line B-B' in FIG. 3. Referring to FIG. 27, In one embodiment, the display panel further includes a first capacitor 110, where the first capacitor 110 includes a first electrode plate 111 and a second electrode plate 112. The first electrode plate 111 and the second electrode plate 112 are disposed on the side of the second active layer 94 facing away from the base substrate 11. The first sub signal line 21 and one, facing away from the base substrate 11, of the first electrode plate 111 and the second electrode plate 112 are disposed in a same film layer.

In one embodiment, the materials of the first electrode plate 111 and the second electrode plate 112 may be according to practical situations and are not limited herein. Exemplarily, the materials of the first electrode plate 111 and the second electrode plate 112 may be molybdenum, titanium aluminum titanium, etc. In one embodiment, the specific positions of the first electrode plate 111 and the second electrode plate 112 in the display panel may be according to practical situations and are not limited herein. Typical examples are described below, which are not described herein.

It is to be understood that through the setting of the first sub signal line 21 and one, facing away from the base substrate 11, of the first electrode plate 111 and the second electrode plate 112 being disposed in a same film layer, exemplarily, as shown in FIG. 27, the first electrode plate 111 being disposed on one side of the second electrode plate 112 facing away from the base substrate 11, and the first sub signal line 21 and the first electrode plate 111 being disposed in a same layer, thus, the depth of the via hole for connecting the first sub signal line 21 and the second sub signal line 22 can be made shallower than the depth of the via hole in the second transistor 90, that is, the depth of the via hole for connecting the first sub signal line 21 and the second sub signal line 22 is made relatively shallow, so that the signal loss of the first signal line 20 due to the via hole is facilitated to be reduced, the process requirements can be relatively low, and the process is facilitated to be simplified.

Figure 28:
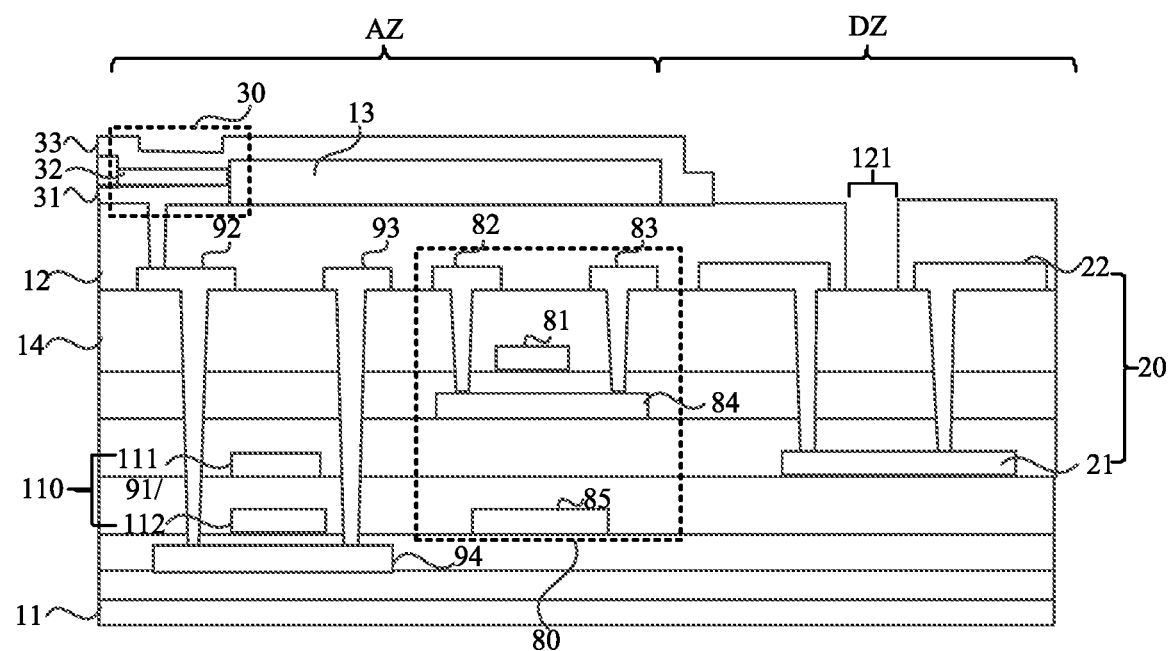
FIG. 28 is another cross-sectional view taken along the section line B-B' in FIG. 3.

FIG. 28 is another cross-sectional view taken along the section line B-B' in FIG. 3. Referring to FIG. 27 and FIG. 28, In one embodiment, the first transistor 80 further includes the third gate electrode 85, the first gate electrode 81 is disposed on the side of the first active layer 84 facing away from the base substrate 11, and the third gate electrode 85 is disposed on the side of the first active layer 84 facing toward the base substrate 11. The second gate electrode 91 functions as the second electrode plate 112, and the first electrode plate 11 and the third gate electrode 85 are disposed in a same layer (as shown in FIG. 27); or the third gate electrode 85 functions as the first electrode plate 111, and the second electrode plate 112 and the second gate electrode 91 are disposed in a same layer (as shown in FIG. 28).

It is to be understood that through the setting of the second gate electrode 91 being multiplexed as the second electrode plate 112 and the first electrode plate 111 and the third gate electrode 85 being disposed in a same layer, the second gate electrode 91 and the second electrode plate 112 can be formed by a same process, and the first electrode plate 111 and the third gate electrode 85 can be formed by a same process, so that the manufacturing process of the display panel is facilitated to be simplified and the cost is lowered. Similarly, through the setting of the third gate electrode 85 being multiplexed as the first electrode plate 111 and the second electrode plate 112 and the second gate electrode 91 being disposed in a same layer, the third gate electrode 85 and the first electrode plate 111 can be formed by a same process, and the second electrode plate 112 and the second gate electrode 91 can be formed by a same process, so that the manufacturing process of the display panel is facilitated to be simplified and the cost is lowered.

It is further to be understood that when the first capacitor 110 is used as a storage capacitor in the pixel driving circuit and is electrically connected to the drive transistor, along the direction perpendicular to the base substrate 11, the first capacitor 110 may be disposed overlapping with the drive transistor. Exemplarily, when the first transistor 80 is the drive transistor, the third gate electrode 85 may be multiplexed as the first electrode plate 111, and the second electrode plate 112 and the second gate electrode 91 are disposed in a same layer; when the second transistor 90 is the drive transistor, the second gate electrode 91 may be multiplexed as the second electrode plate 112, and the first electrode plate 111 and the third gate electrode 85 are disposed in a same layer. Thus, the connection between the first capacitor 110 and the drive transistor is facilitated to be achieved.

Figure 29:
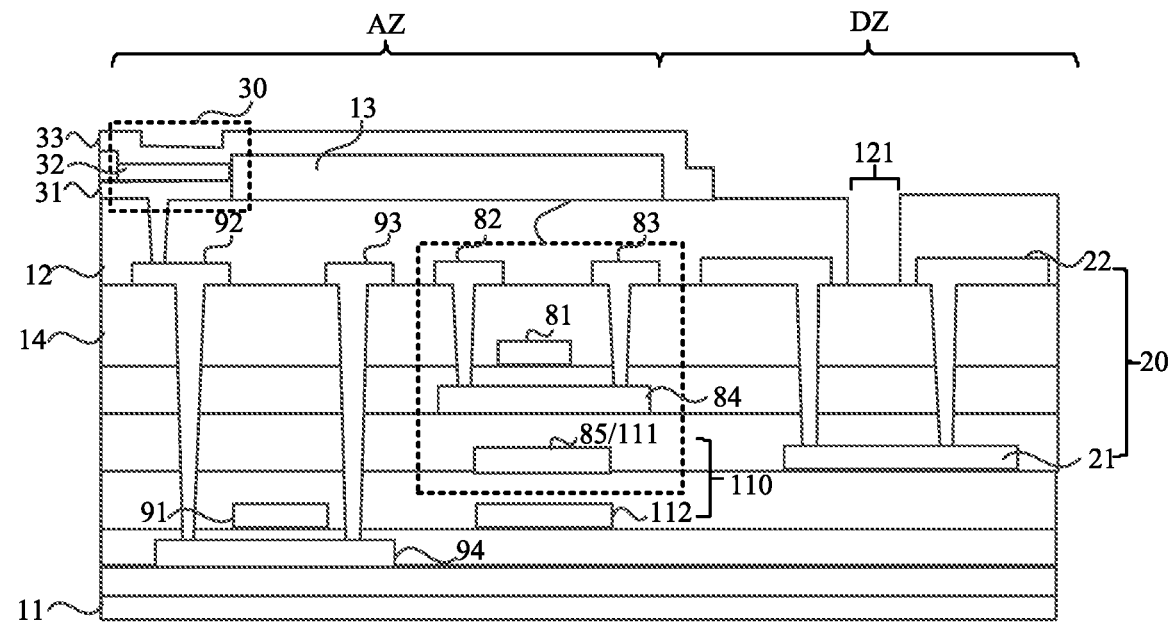
FIG. 29 is another cross-sectional view taken along the section line B-B' in FIG. 3.

FIG. 29 is another cross-sectional view taken along the section line B-B' in FIG. 3. Referring to FIG. 29, In one embodiment, the first transistor 80 further includes the third gate electrode 85, the first gate electrode 81 is disposed on the side of the first active layer 84 facing away from the base substrate 11, and the third gate electrode 85 is disposed on the side of the first active layer 84 facing toward the base substrate 11. The first electrode plate 111 is disposed on the side of the second electrode plate 112 facing away from the base substrate 11. The first sub signal line 21 and the first electrode plate 111 are disposed in a same layer, the second gate electrode 91 functions as the second electrode plate 112, and the second gate electrode 91 and the third gate electrode 85 are disposed in a same layer.

It is to be understood that when the first sub signal line 21 is disposed in a same layer as the first electrode plate 11 and adopts the titanium aluminum titanium material, since the thermal expansion coefficients of titanium and aluminum are different and aluminum is easy to shrink to generate cracks, the first sub signal line 21 may be disposed not in a same layer as the third gate electrode 85, so that the third gate electrode 85 can be prevented from generating cracks, and the performance of the first transistor 80 can be improved. At this time, the first transistor 80 may further be the drive transistor.

Figure 30:
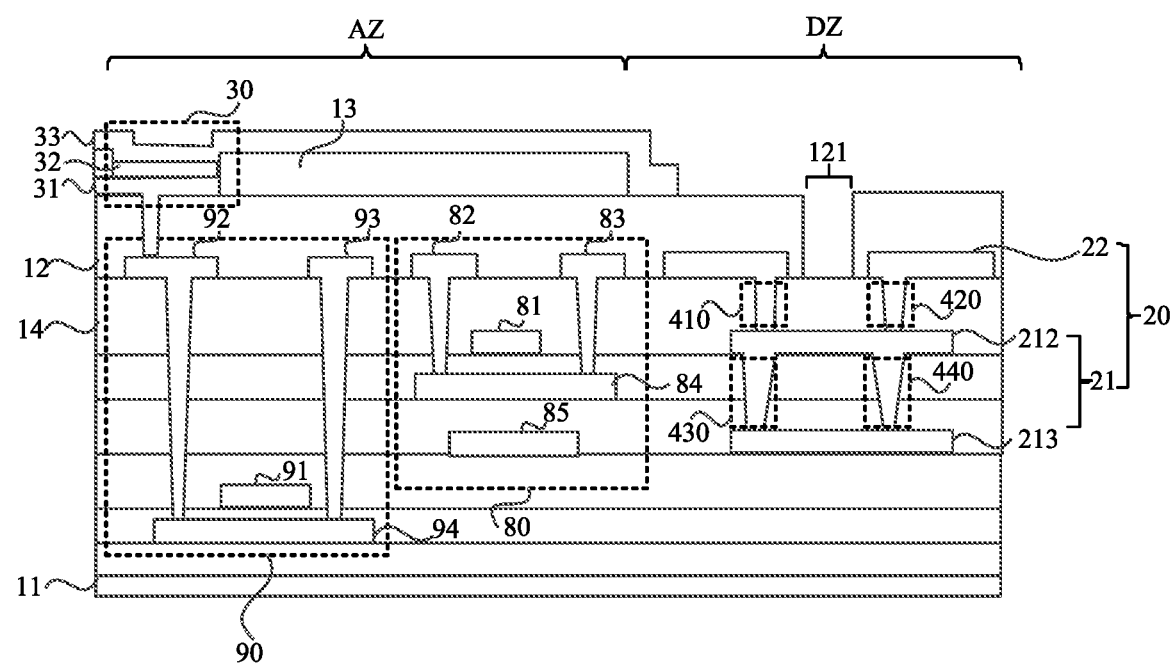
FIG. 30 is another cross-sectional view taken along the section line B-B' in FIG. 3.

FIG. 30 is another cross-sectional view taken along the section line B-B' in FIG. 3. Referring to FIG. 8 and FIG. 30, In one embodiment, the first sub signal line 21 includes the trace in the first layer 212 and the trace in the second layer 213 which are electrically connected to each other and are stacked, and the trace in the second layer 213 is disposed on one side of the trace in the first layer 212 facing toward the base substrate 11. The trace in the first layer 212 is connected to the second sub signal line 22 through the first via hole 410 and/or the second via hole 420, and the trace in the second layer 213 is connected to the trace in the first layer 212 through a fourth via hole 440 and/or a fifth via hole 450.

It is to be understood that through the setting of the first sub signal line 21 as double-layer traces, the resistance on the first sub signal line 21 can be fully reduced, and the signal loss can be avoided. In addition, compared with the second sub signal line 22 being directly connected to the first sub signal line 21 through a via hole, the first sub signal line 21 being connected to the second sub signal line 22 through two via holes allows the depth of each via hole to be made relatively shallow, the signal loss of the first signal line 20 due to the via hole can be reduced, the process requirements can be relatively low, and the process is facilitated to be simplified.

Figure 31:
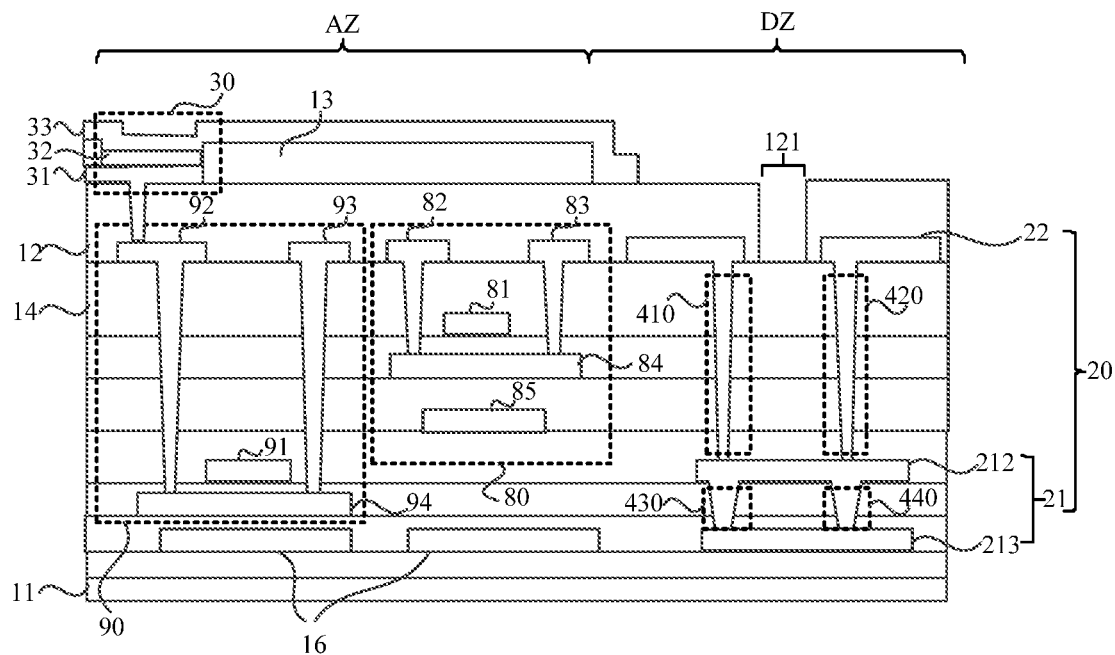
FIG. 31 is a cross-sectional view taken along the section line B-B' in FIG. 3.

FIG. 31 is a cross-sectional view taken along the section line B-B' in FIG. 3. Referring to FIG. 31, In one embodiment, the display panel further includes a light shielding layer 16, where the light shielding layer 16 is disposed on one side of the second active layer 94 facing toward the base substrate 11. The trace in the first layer 212 and the trace in the second layer 213 are disposed in any two layers of film layers where the first gate electrode 81, the second gate electrode 91, the third gate electrode 85 and the shielding layer 16 are disposed.

In one embodiment, the light shielding layer 16 includes a plurality of light shielding blocks for preventing external light from shining on the first active layer 84 of the first transistor 80 and the second active layer 94 of the second transistor 90, preventing the first transistor 80 and the second transistor 90 from generating leakage currents due to illumination.

In one embodiment, the trace in the first layer 212 and the trace in the second layer 213 may be achieved through a plurality of specific implementations, and typical examples are described below. Exemplarily, when the trace in the first layer 212 is disposed in the layer of the first gate electrode 81, the trace in the second layer 213 may be disposed in the layer of the second gate electrode 91, the layer of the third gate electrode 85 or the light shielding layer 16. When the trace in the first layer 212 is disposed in the layer of the third gate electrode 85, the trace in the second layer 213 may be disposed in the layer of the second gate electrode 91 or the light shielding layer 16. When the trace in the first layer 212 is disposed in the layer of the second gate electrode 91, the trace in the second layer 213 may be disposed in the light shielding layer 16.

Figure 32:
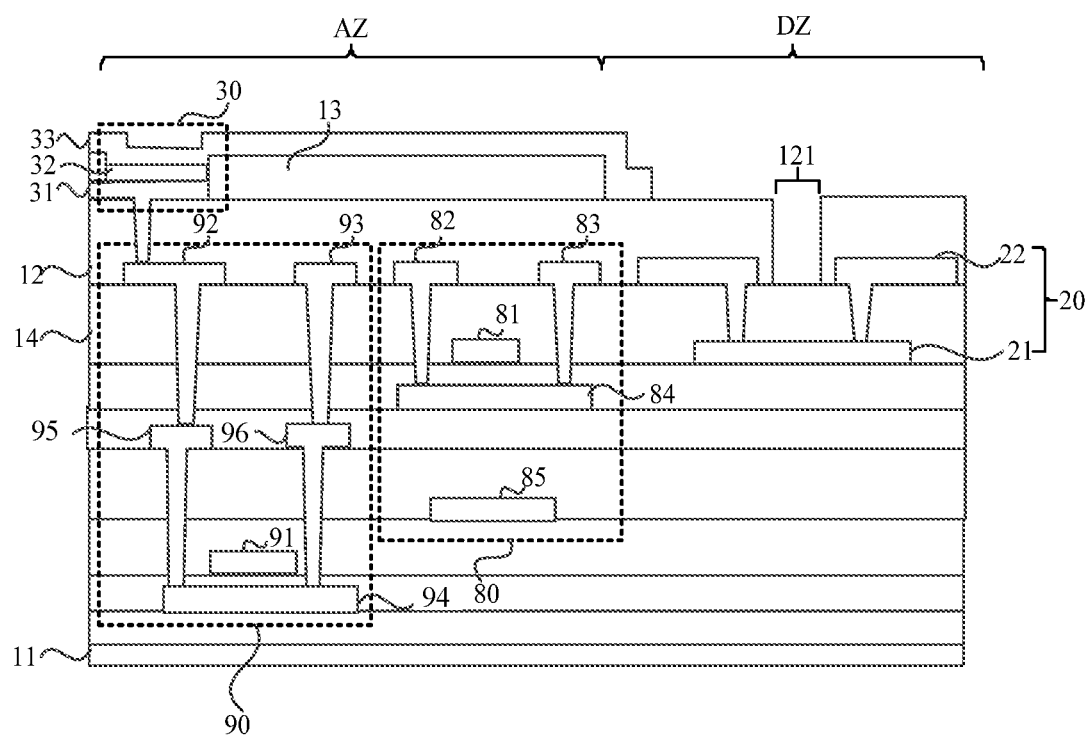
FIG. 32 is another cross-sectional view taken along the section line B-B' in FIG. 3.

FIG. 32 is another cross-sectional view taken along the section line B-B' in FIG. 3. Referring to FIG. 32, In one embodiment, the second transistor 90 includes a third source electrode 95 and a third drain electrode 96, the third source electrode 95 is disposed between the second source electrode 92 and the second active layer 94, and the third drain electrode 96 is disposed between the second drain electrode 93 and the second active layer 94. The third source electrode 95 is connected to the second active layer 94 through a via hole, the second source electrode 92 is connected to the third source electrode 95 through a via hole, the third drain electrode 96 is connected to the second active layer 94 through a via hole, and the second drain electrode 93 is connected to the third drain electrode 96 through a via hole.

In one embodiment, the specific materials of the third electrode plate 96 and the third electrode plate 95 may be according to practical situations and are not limited herein. Exemplarily, the materials of the third gate electrode 96 and the third gate electrode 95 may be titanium aluminum titanium, titanium aluminum titanium, etc.

It is to be understood that when the first sub signal line 21 is disposed on one side of the second source electrode 92 and the second drain electrode 93 facing toward the base substrate 11 and adopts the titanium aluminum titanium material, since the titanium aluminum titanium material cannot bear high temperature, it is not applicable to perform a high-temperature dehydrogenation step on the second active layer 94 after the via holes for filling the second source electrode 92 and the second drain electrode 93 are formed. However, the adding of the third source electrode 95 and the third drain electrode 96 enables the high-temperature dehydrogenation step on the second active layer 94 to be performed after the via holes for filling the third source electrode 95 and the third drain electrode 96 are formed and before the first sub signal line 21 is formed, so that the performance of the second transistor 90 can be improved without damaging the first sub signal line 21, and the yield of the display panel can be improved. At this time, the second transistor may serve as the drive transistor.

It is further to be understood that compared with the second source electrode 92 and the second drain electrode 93 being directly connected to the second active layer 94 through a via hole, the second source electrode 92 and the second drain electrode 93 being connected to the second active layer 94 through two via holes allows the depth of each via hole to be made relatively shallow, the process requirements can be relatively low, and the process is facilitated to be simplified.

Figure 33:
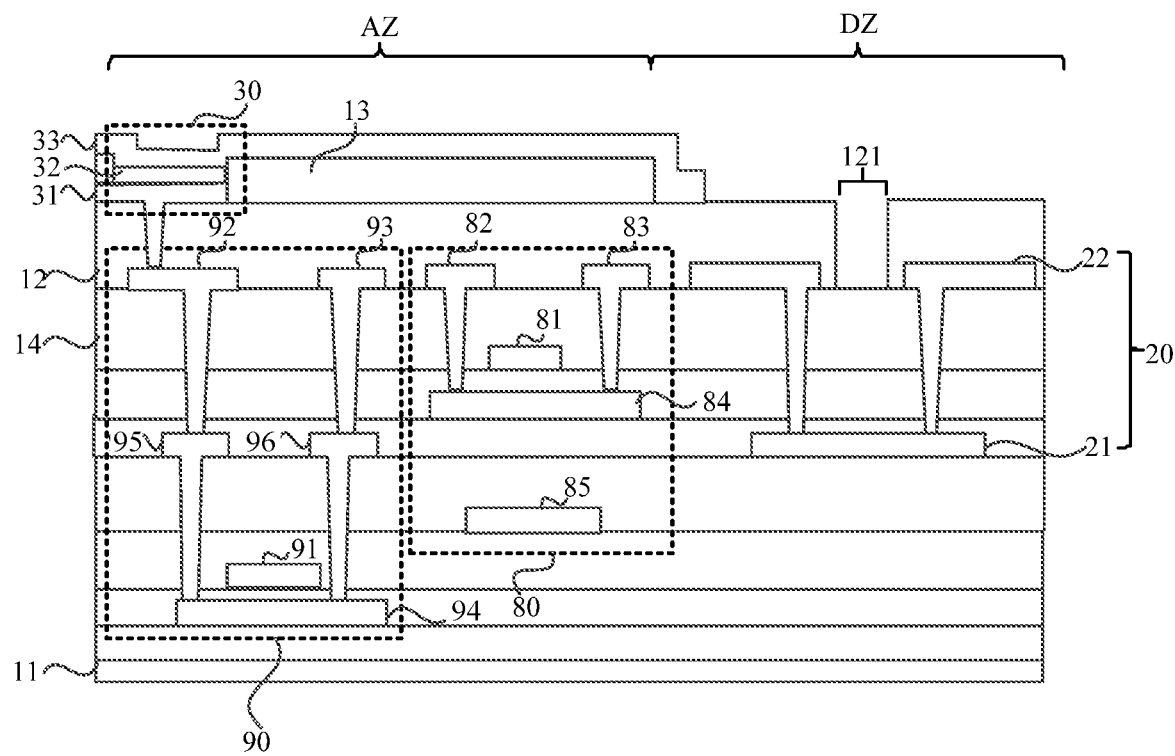
FIG. 33 is another cross-sectional view taken along the section line B-B' in FIG. 3.

FIG. 33 is another cross-sectional view taken along the section line B-B' in FIG. 3. Referring to FIG. 33, In one embodiment, the first sub signal line 21 is disposed in a same film layer as at least one of the third source electrode 95 and the third drain electrode 96.

In one embodiment, when the second sub signal line 22 and the second source electrode 92 (or the second drain electrode 93) are disposed in a same layer, through the setting of the first sub signal line 21 and the third source electrode 95 (or the third drain electrode 96) being disposed in a same layer, the via hole for connecting the first sub signal line 21 and the second sub signal line 22 and the via hole for connecting the second source electrode 92 (or the second drain electrode 93) and the third source electrode 95 (or the third drain electrode 96) can be formed by a same process, and it is not necessary to additionally add a process for providing the via hole for connecting the first sub signal line 21 and the second sub signal line 22, so that the manufacturing process of the display panel can be simplified and the cost is lowered.

Exemplarily, FIG. 33 shows that the first source electrode 82, the first drain electrode 83, the second source electrode 92, the second drain electrode 92 and the second sub signal line 22 are disposed in a same layer, and the third source electrode 95, the third drain electrode 96 and the first sub signal line 21 are disposed in a same layer. Thus, the via hole for connecting the second source electrode 92 and the third source electrode 95, the via hole for connecting the second source electrode 93 and the third drain electrode 96 and the via hole for connecting the first sub signal line 21 and the second sub signal line 22 may be formed by a same process, so that the manufacturing process of the display panel can be simple.

Based on the same inventive concept, the embodiments of the present disclosure further provide a display device. The display device includes the display panel according to any one of the embodiments of the present disclosure. Therefore, the display device has the beneficial effects of the display panel provided by the embodiments of the present disclosure. The same content may be understood by referring to the above description and will not be repeated below.

Figure 34:
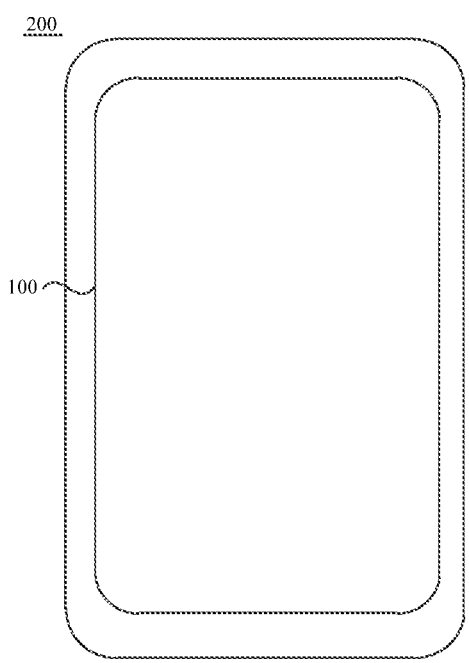
FIG. 34 is a structural diagram of a display device according to an embodiment of the present disclosure.

Exemplarily, FIG. 34 is a structural diagram of a display device according to an embodiment of the present disclosure. As shown in FIG. 34, the display device 200 provided by the embodiments of the present disclosure includes the display panel 100 provided by the embodiments of the present disclosure. The display device 200 may, exemplarily, be any electronic device with a display function such as a touch display screen, a mobile phone, a tablet computer, a notebook computer or a television.

What is claimed is:

1. A display panel, comprising:
    a base substrate;
    a first signal line, which is disposed on the base substrate, wherein the first signal line comprises a first sub signal line and a second sub signal line which are electrically connected to each other and are disposed in different layers, and the first sub signal line is disposed on one side of the second sub signal line facing toward the base substrate;
    a planarization layer, which is disposed on one side of the first signal line facing away from the base substrate; and
    a light-emitting element and a pixel spacer layer, which are disposed on one side of the planarization layer facing away from the base substrate; wherein
    the planarization layer comprises a first opening, and along a direction perpendicular to the base substrate, the first sub signal line at least partially overlaps with the first opening;
    wherein the second sub signal line comprises a first line segment and a second line segment, at least part of the first line segment extends to a display region of the display panel, and the first sub signal line is disposed in a non-display region of the display panel; and
    a first end of the first sub signal line is connected to an end of the first line segment through a first via hole, the first via hole is disposed in the non-display region, and along the a projection direction is a direction perpendicular to the base substrate, the first via hole does not overlap with the first opening along the projection direction.

2. The display panel according to claim 1, wherein the second sub signal line comprises a first side edge closest to the first opening, and the first side edge is completely covered by the planarization layer.

3. The display panel according to claim 1, wherein the second line segment is disposed in the non-display region, and a second end of the first sub signal line is connected to an end of the second line segment through a second via hole; and
    the second via hole is disposed in the non-display region, and along the direction perpendicular to the base substrate, the second via hole does not overlap with the first opening.

4. The display panel according to claim 1, wherein the second sub signal line is disposed in the display region of the display panel and is connected to an active layer of one transistor through a third via hole; and along the direction perpendicular to the base substrate, a depth of the first via hole is H1, a depth of the third via hole is H3, and H1≤½×H3.

5. The display panel according to claim 1, wherein along the direction perpendicular to the base substrate, a first insulating layer is disposed between the first sub signal line and the first opening, and the first insulating layer comprises silicon oxide or silicon oxynitride.

6. The display panel according to claim 1, comprising:
    a first transistor and a second transistor, wherein
    the first transistor comprises a first gate electrode, a first source electrode, a first drain electrode and a first active layer;
    the second transistor comprises a second gate electrode, a second source electrode, a second drain electrode and a second active layer;
    the first active layer comprises an oxide semiconductor, the second active layer comprises silicon, and the first active layer is disposed on one side of the second active layer facing away from the base substrate; and
    the second sub signal line is disposed in a same layer as at least one of the first source electrode, the first drain electrode, the second source electrode or the second drain electrode.

7. The display panel according to claim 6, wherein the first gate electrode is disposed on one side of the second gate electrode facing away from the base substrate.

8. The display panel according to claim 6, wherein the first sub signal line is disposed on one side of the first active layer facing away from the base substrate.

9. The display panel according to claim 6, wherein the first sub signal line and the first gate electrode are disposed in a same film layer.

10. The display panel according to claim 6, wherein the first transistor further comprises a third gate electrode, the first gate electrode is disposed on one side of the first active layer facing away from the base substrate, and the third gate electrode is disposed on one side of the first active layer facing toward the base substrate; and
    the first gate electrode and the third gate electrode are both disposed on one side of the second gate electrode facing away from the base substrate, and the first sub signal line is disposed in a same film layer as the first gate electrode or the third gate electrode.

11. The display panel according to claim 6, wherein the second transistor comprises a third source electrode and a third drain electrode, the third source electrode is disposed between the second source electrode and the second active layer, and the third drain electrode is disposed between the second drain electrode and the second active layer; and
    the third source electrode is connected to the second active layer through a via hole, the second source electrode is connected to the third source electrode through a via hole, the third drain electrode is connected to the second active layer through a via hole, and the second drain electrode is connected to the third drain electrode through a via hole.

12. A display device, comprising a display panel, wherein the display panel comprises:
    a base substrate;
    a first signal line, which is disposed on the base substrate, wherein the first signal line comprises a first sub signal line and a second sub signal line which are electrically connected to each other and are disposed in different layers, and the first sub signal line is disposed on one side of the second sub signal line facing toward the base substrate;
a planarization layer, which is disposed on one side of the first signal line facing away from the base substrate; and
a light-emitting element and a pixel spacer layer, which are disposed on one side of the planarization layer facing away from the base substrate; wherein
the planarization layer comprises a first opening, and along a direction perpendicular to the base substrate, the first sub signal line at least partially overlaps with the first opening;
wherein the second sub signal line comprises a first line segment and a second line segment, at least part of the first line segment extends to a display region of the display panel, and the first sub signal line is disposed in a non-display region of the display panel; and
a first end of the first sub signal line is connected to an end of the first line segment through a first via hole, the first via hole is disposes in the non-display region, and along the a projection direction is a direction perpendicular to the base substrate, the first via hole does not overlap with the first opening along the projection direction.

13. A display panel, comprising:
a base substrate;
a first signal line, which is disposed on the base substrate, wherein the first signal line comprises a first sub signal line and a second sub signal line which are electrically connected to each other and are disposed in different layers, and the first sub signal line is disposed on one side of the second sub signal line facing toward the base substrate;
a planarization layer, which is disposed on one side of the first signal line facing away from the base substrate; and
a light-emitting element and a pixel spacer layer, which are disposed on one side of the planarization layer facing away from the base substrate; wherein
the planarization layer comprises a first opening, and along a direction perpendicular to the base substrate, the first sub signal line at least partially overlaps with the first opening,
wherein the display panel further comprises a second signal line, wherein the second signal line and the second sub signal line are disposed in a same film layer, and along the direction perpendicular to the base substrate, the first sub signal line at least partially overlaps with the second signal line.

14. The display panel according to claim 13, wherein
along the direction perpendicular to the base substrate, the second signal line at least partially overlaps with the first opening, and any side edge of the second signal line does not overlap with the first opening.

15. The display panel according to claim 14, wherein along the direction perpendicular to the base substrate, an orthographic projection of the first opening on the base substrate is located within an orthographic projection of the second signal line on the base substrate.

16. The display panel according to claim 14, comprising:
a display region and a non-display region, wherein the first opening is disposed in the non-display region,
the light-emitting element comprises a cathode layer, and along the direction perpendicular to the base substrate, the cathode layer does not overlap with the first opening; and
a connection electrode layer, wherein the second signal line is electrically connected to the cathode layer through the connection electrode layer,
the connection electrode layer is connected to the second signal line on a position where the first opening is located and is connected to the cathode layer on one side of the first opening closest to the display region.

17. The display panel according to claim 16, further comprising: a second opening disposed on one side of the first opening facing away from the display region, wherein
along the direction perpendicular to the base substrate, the second signal line does not overlap with the second opening; or
along the direction perpendicular to the base substrate, the second signal line at least partially overlaps with the second opening, and any side edge of the second signal line does not overlap with the second opening.

18. The display panel according to claim 17, wherein along the direction perpendicular to the base substrate, the second signal line at least partially overlaps with the second opening, and any side edge of the second signal line does not overlap with the second opening; and
the connection electrode layer is connected to the second signal line on a position where the second opening is located.

19. The display panel according to claim 17, wherein a first barrier wall is disposed between the first opening and the second opening, and the first barrier wall is disposed in a same layer as the pixel spacer layer.

* * * * *